US011621279B2

(12) United States Patent
Yaginuma

(10) Patent No.: US 11,621,279 B2
(45) Date of Patent: Apr. 4, 2023

(54) SEMICONDUCTOR DEVICE HAVING A DIODE FORMED IN A FIRST TRENCH AND A BIDIRECTIONAL ZENER DIODE FORMED IN A SECOND TRENCH

(71) Applicant: ROHM CO., LTD., Kyoto (JP)

(72) Inventor: Ryuta Yaginuma, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 78 days.

(21) Appl. No.: 16/425,568

(22) Filed: May 29, 2019

(65) Prior Publication Data

US 2019/0371820 A1 Dec. 5, 2019

(30) Foreign Application Priority Data

Jun. 1, 2018 (JP) .............................. JP2018-106164

(51) Int. Cl.
| | |
|---|---|
| *H01L 27/12* | (2006.01) |
| *H01L 21/762* | (2006.01) |
| *H01L 23/50* | (2006.01) |
| *H01L 21/84* | (2006.01) |
| *H01L 29/866* | (2006.01) |
| *H01L 29/66* | (2006.01) |

(52) U.S. Cl.
CPC .... *H01L 27/1207* (2013.01); *H01L 21/76224* (2013.01); *H01L 21/84* (2013.01); *H01L 23/50* (2013.01); *H01L 29/66136* (2013.01); *H01L 29/866* (2013.01)

(58) Field of Classification Search
CPC ............. H01L 27/0255; H01L 27/0635; H01L 29/66106; H01L 29/66136; H01L 29/7804; H01L 29/866
See application file for complete search history.

(56) References Cited

U.S. PATENT DOCUMENTS 9,024,379 B2 * 5/2015 Darwish ............... H01L 27/088
257/334
9,461,030 B2 * 10/2016 Nishimura .......... H01L 29/7808
(Continued)

FOREIGN PATENT DOCUMENTS

| JP | 2002270841 A | 9/2002 |
|---|---|---|
| JP | 2008235600 A | 10/2008 |

(Continued)

OTHER PUBLICATIONS

Japanese Patent Office; Notice of Reasons for Refusal for Japanese Patent Application 2018-106164 (related application); UETA, Satoshi; Mar. 10, 2022; 6 pages.

*Primary Examiner* — Anh D Mai
(74) *Attorney, Agent, or Firm* — Gregory M. Howison

(57) ABSTRACT

A semiconductor device includes a semiconductor layer, a transistor cell portion, formed in the semiconductor layer, a first trench, formed in the semiconductor layer, a diode, electrically separated from the transistor cell portion and having a first conductivity type portion and a second conductivity type portion disposed inside the first trench, a second trench, formed in the semiconductor layer, and a bidirectional Zener diode, electrically connected to the transistor cell portion and having a pair of first conductivity type portions, disposed inside the second trench, and at least one second conductivity type portion, formed between the pair of first conductivity type portion.

17 Claims, 32 Drawing Sheets

(56) References Cited

U.S. PATENT DOCUMENTS

| | | | |
|---|---|---|---|
| 9,935,169 B2* | 4/2018 | Nishimura | H01L 29/861 |
| 2002/0135037 A1* | 9/2002 | Tomomatsu | H01L 29/7395 |
| | | | 257/467 |
| 2009/0230500 A1* | 9/2009 | Yoshikawa | H01L 27/0255 |
| | | | 257/470 |
| 2011/0062545 A1* | 3/2011 | Nakajima | H01L 29/66712 |
| | | | 257/470 |
| 2013/0314834 A1 | 11/2013 | Tamaki et al. | |
| 2016/0241018 A1* | 8/2016 | Nakano | H01L 29/16 |
| 2017/0194483 A1* | 7/2017 | Ng | H01L 29/7827 |
| 2017/0256536 A1* | 9/2017 | Nishida | H01L 29/7397 |
| 2017/0322239 A1 | 11/2017 | Shibib et al. | |

FOREIGN PATENT DOCUMENTS

| | | |
|---|---|---|
| JP | 2013033970 A | 2/2013 |
| JP | 2013247804 A | 12/2013 |
| JP | 2014053554 A | 3/2014 |
| JP | 2014232803 A | 12/2014 |

\* cited by examiner

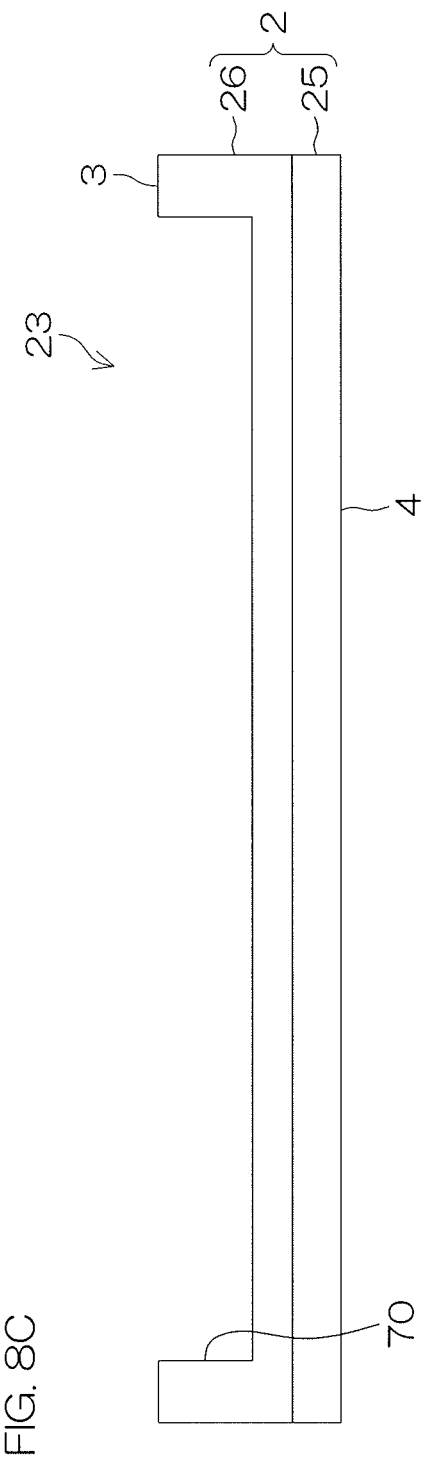

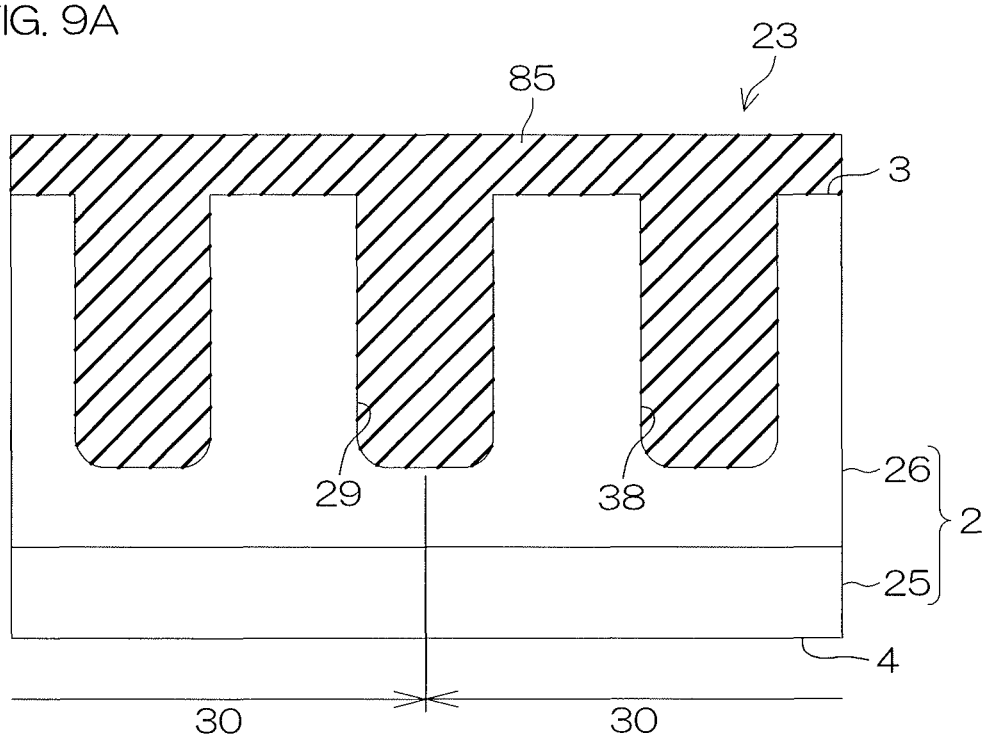

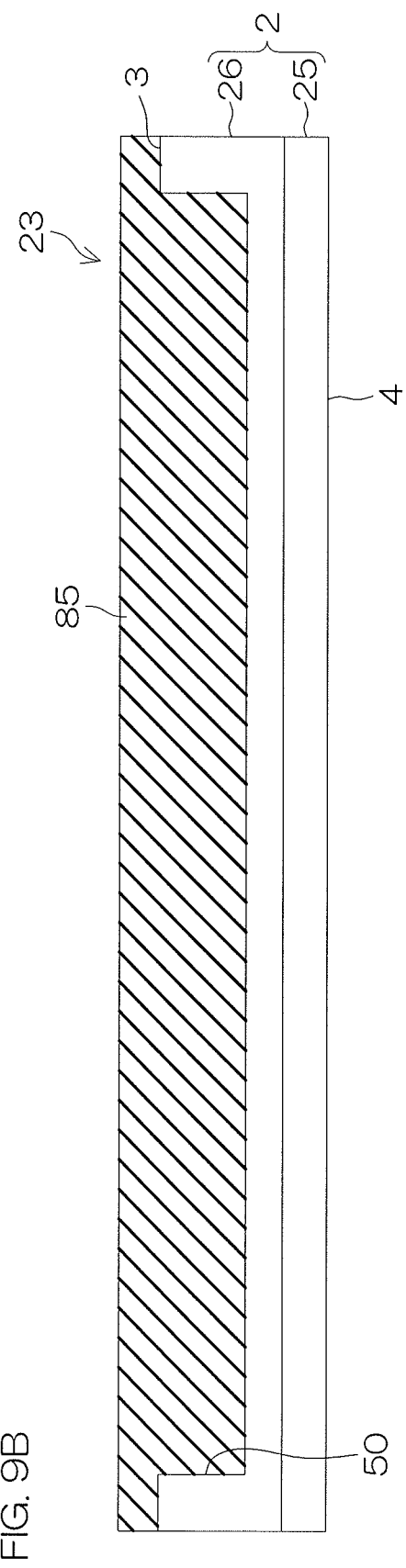

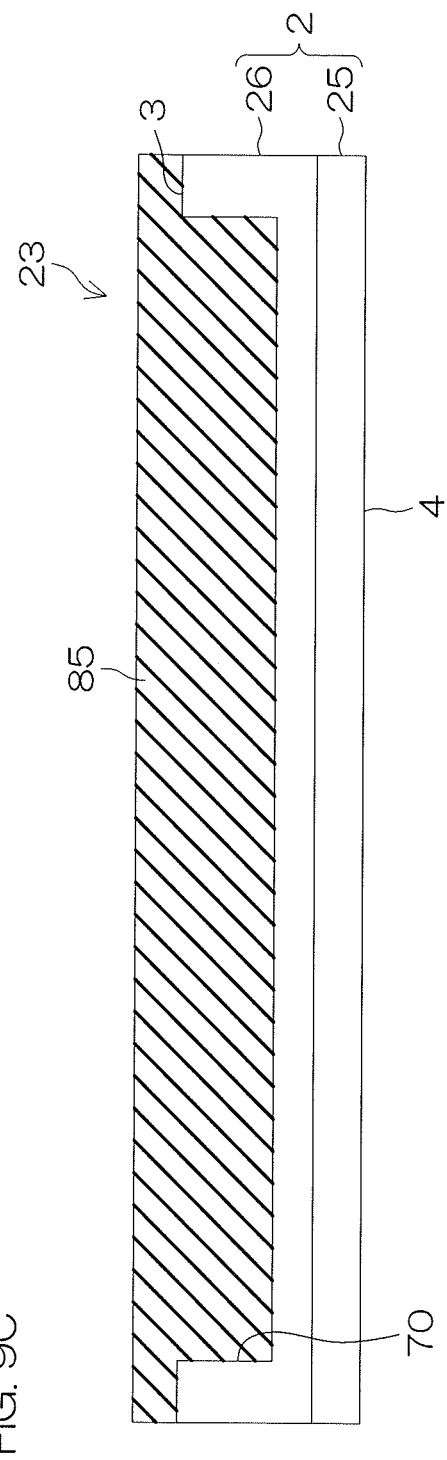

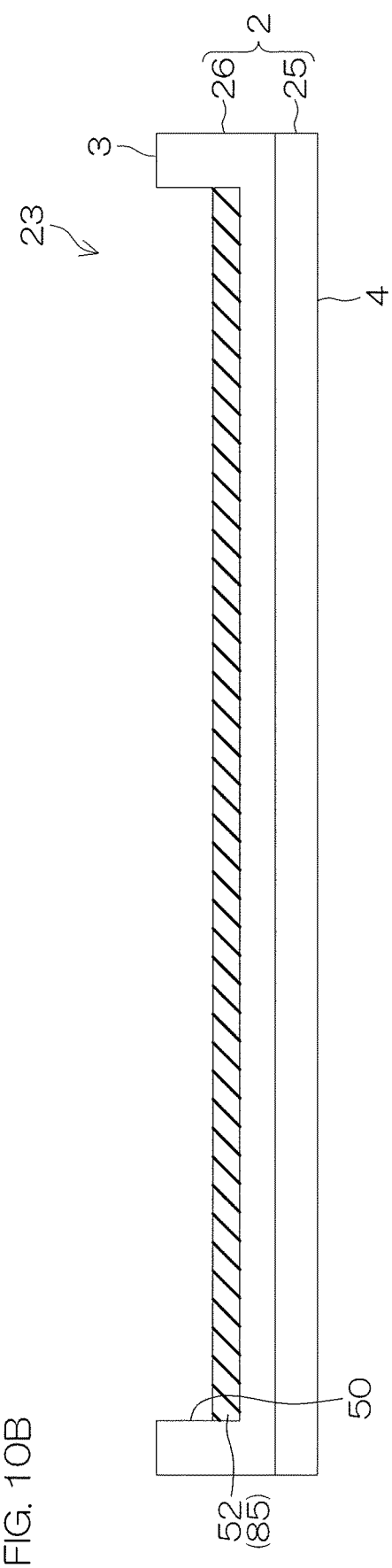

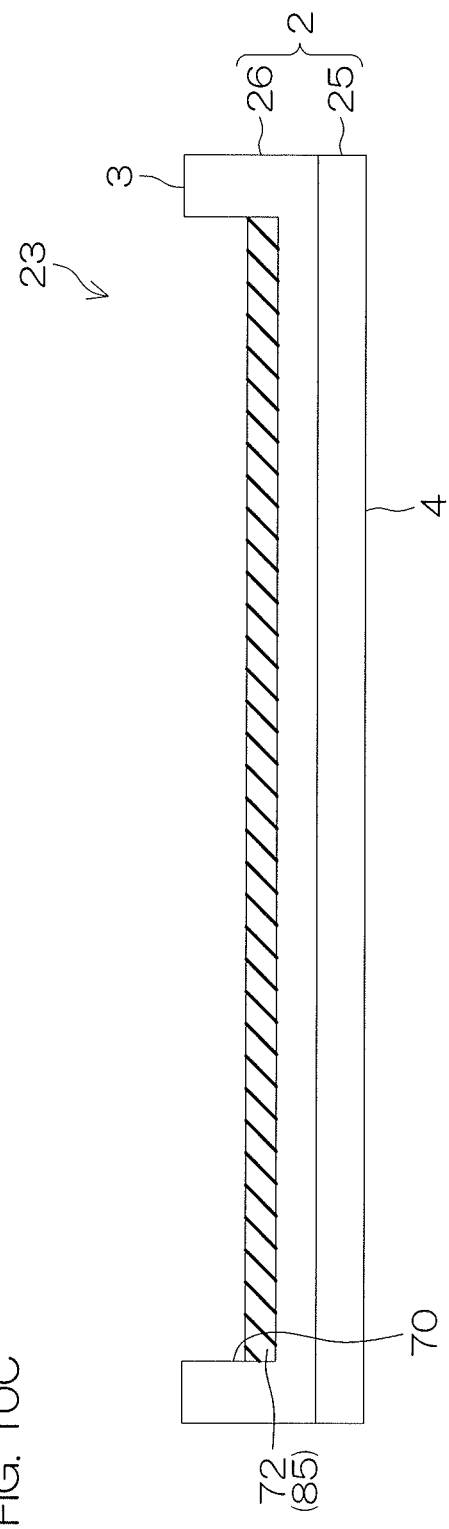

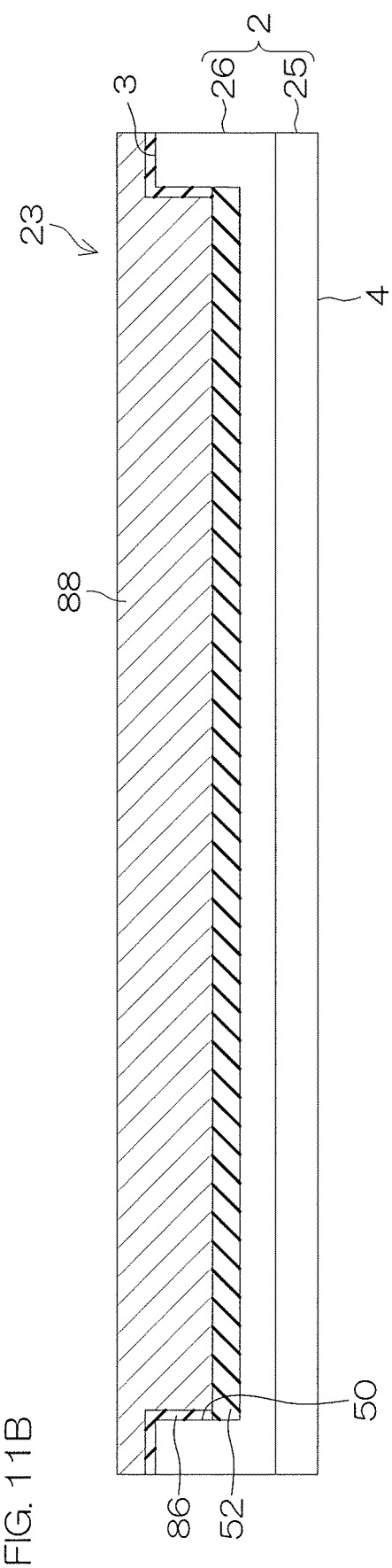

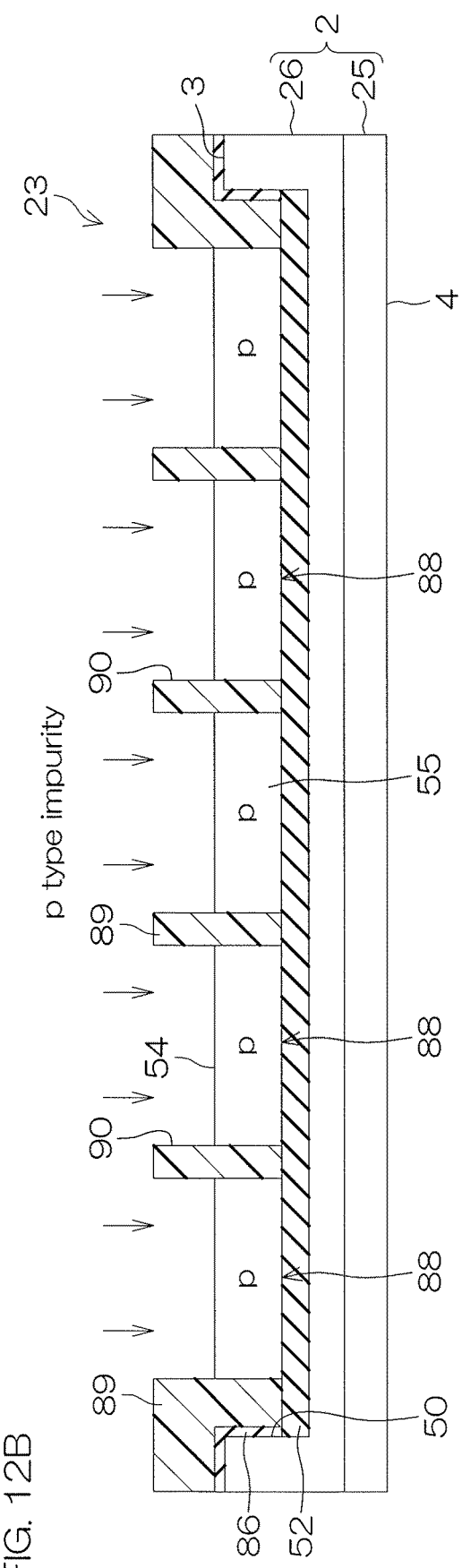

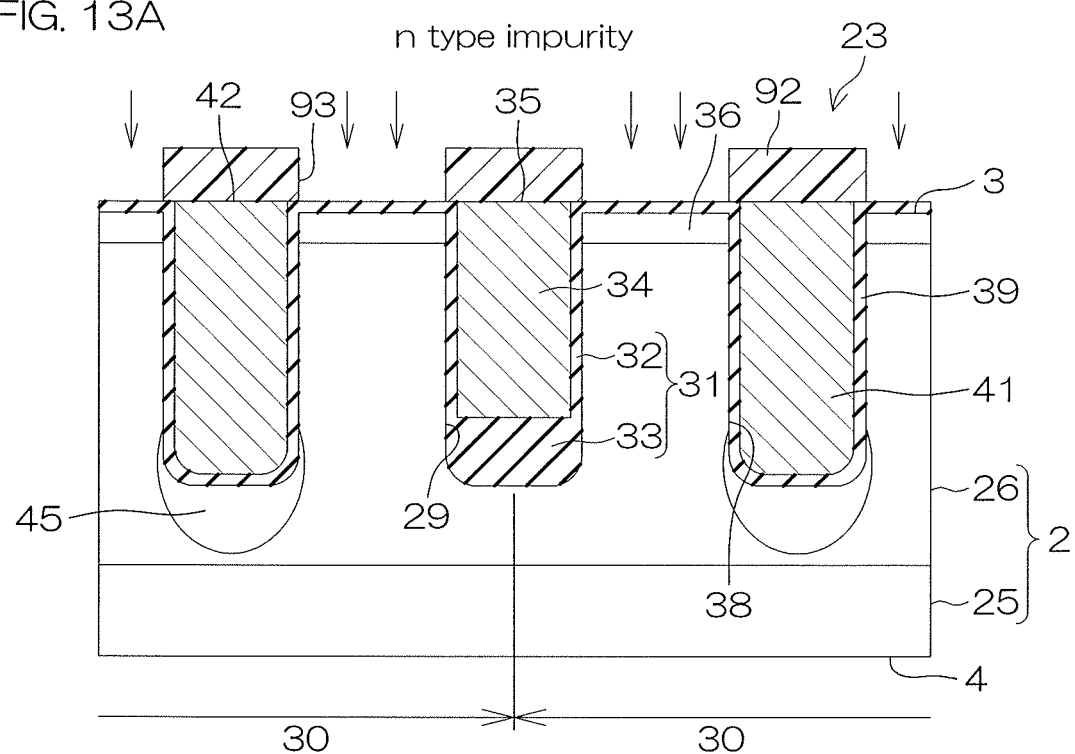

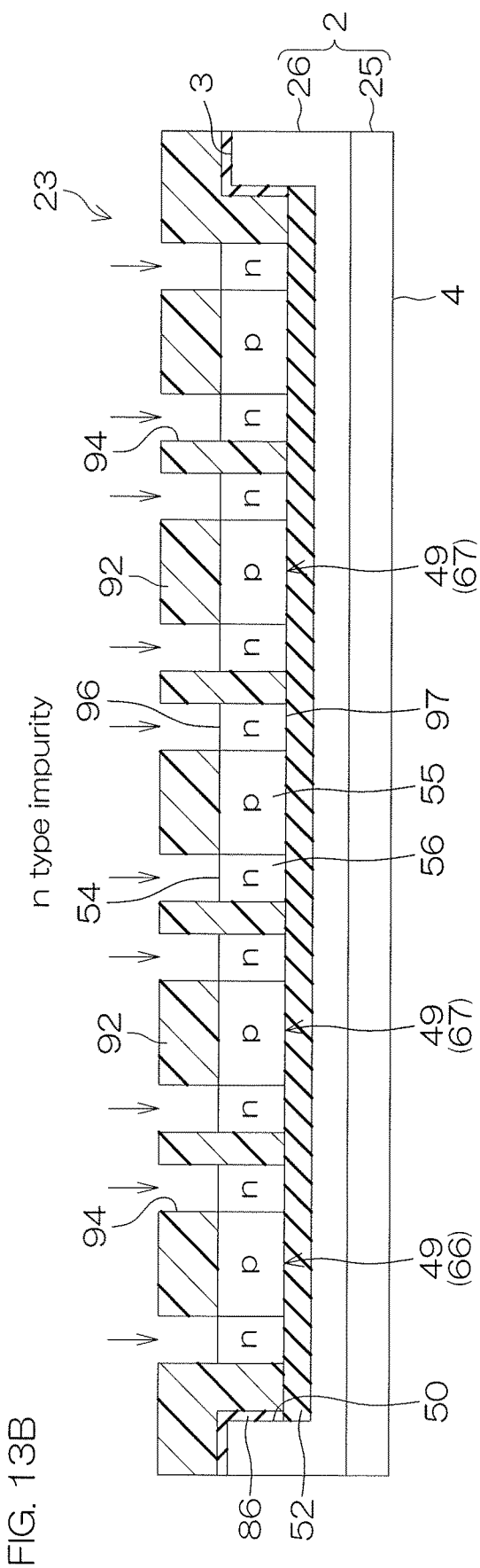

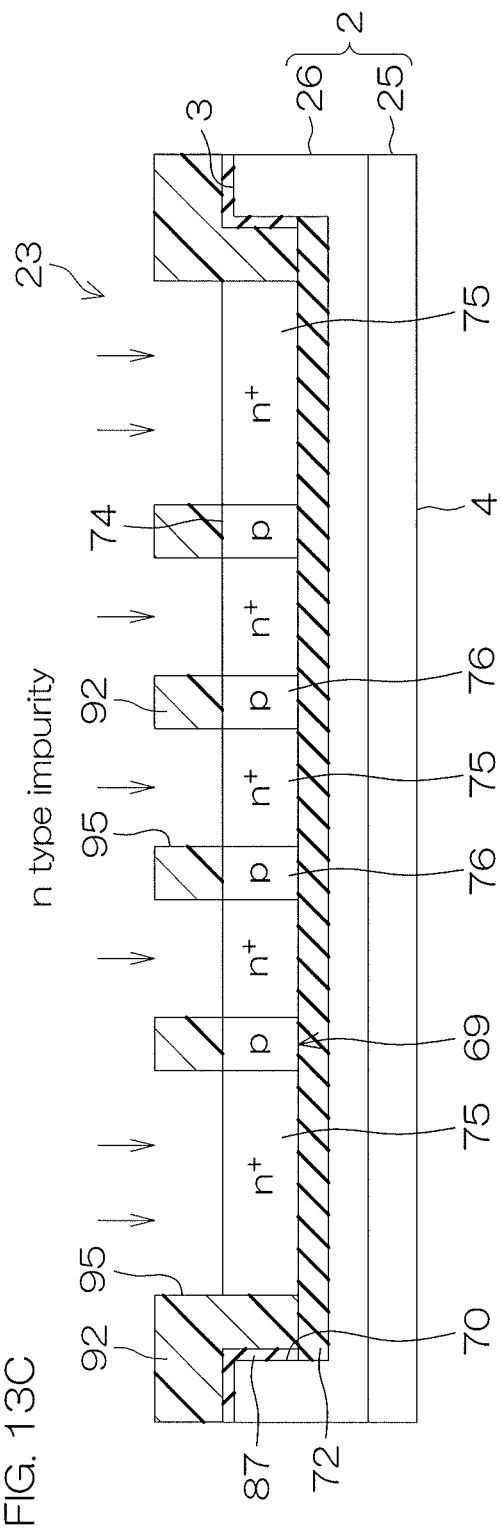

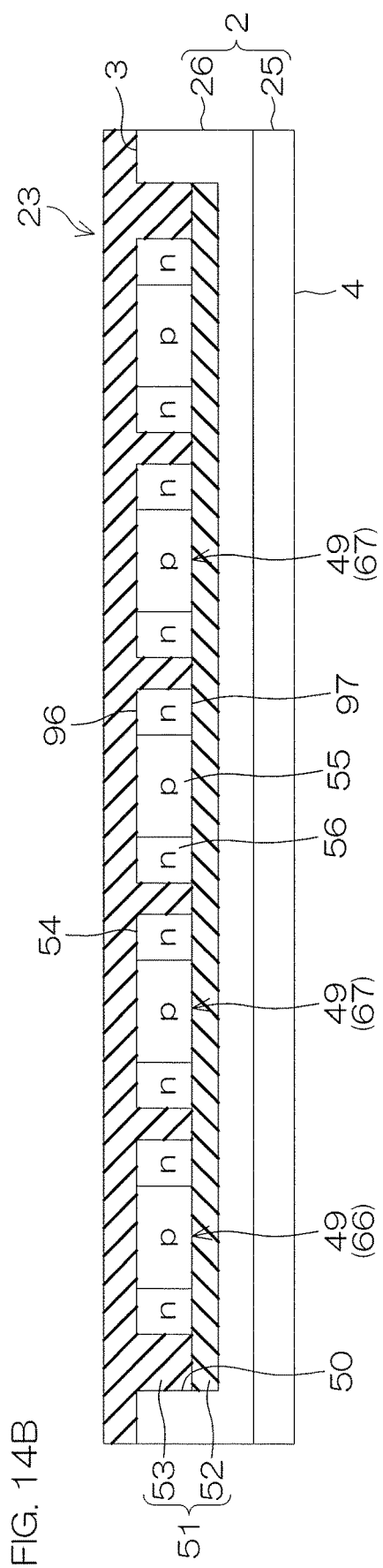

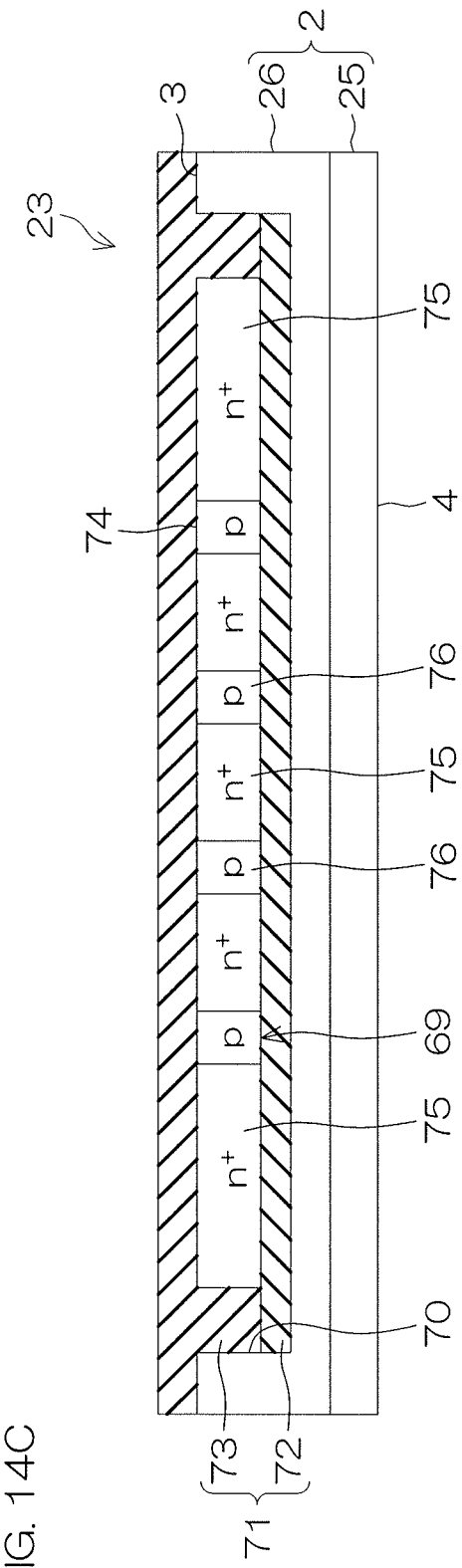

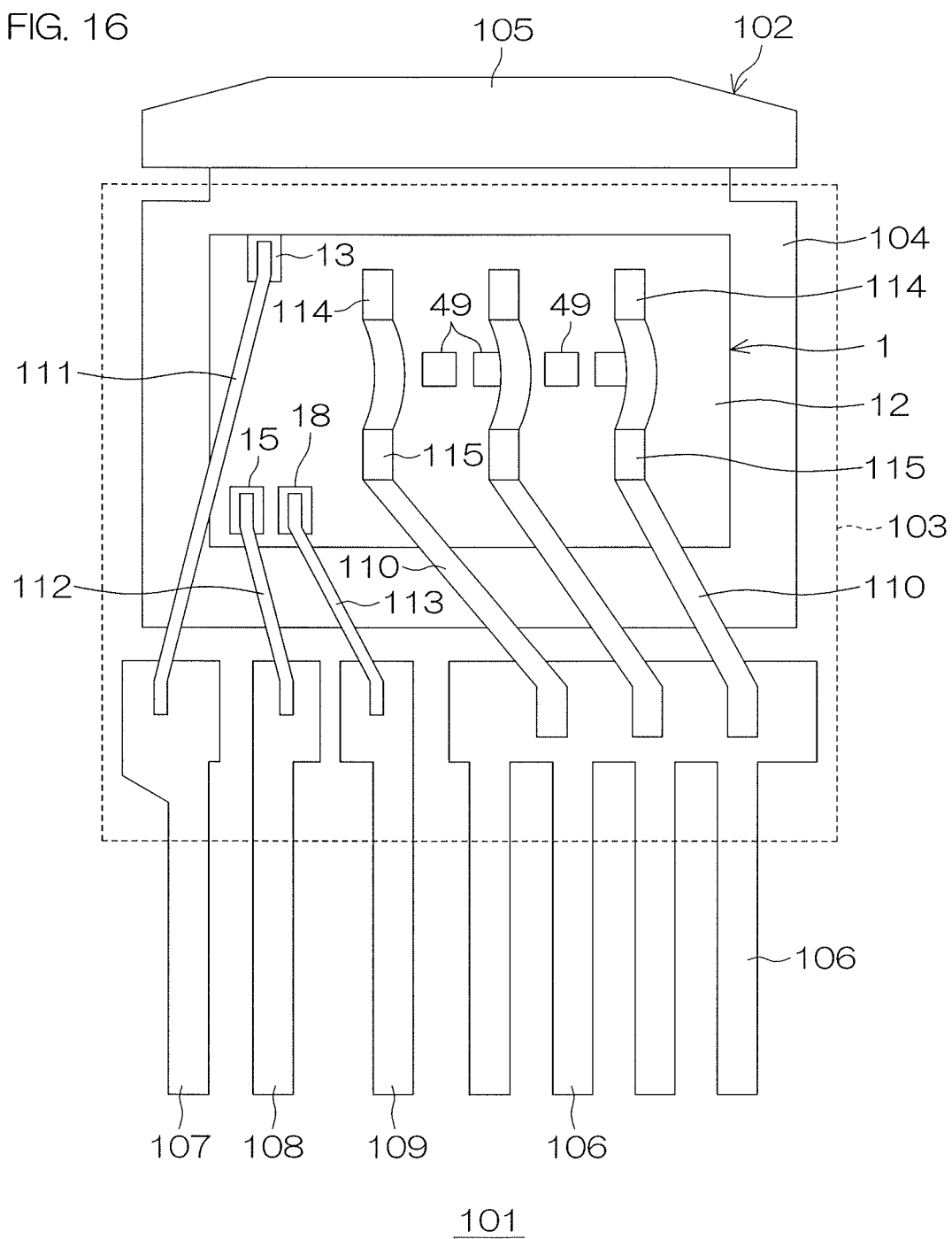

SEMICONDUCTOR DEVICE HAVING A DIODE FORMED IN A FIRST TRENCH AND A BIDIRECTIONAL ZENER DIODE FORMED IN A SECOND TRENCH

CROSS-REFERENCE TO RELATED APPLICATIONS

The present application corresponds to Japanese Patent Application No. 2018-106164 filed in the Japan Patent Office on Jun. 1, 2018 and the entire disclosure of this application is incorporated herein by reference.

TECHNICAL FIELD

The present invention relates to a method for manufacturing a semiconductor device.

BACKGROUND

With a semiconductor device, when, for example, an overcurrent continues to flow during a short circuit, thermal destruction occurs in some cases. In order to prevent this problem, for example, Patent Document 1 (Japanese Patent Application Publication No. 2013-247804) discloses a semiconductor device that includes a semiconductor switching device, a semiconductor driving circuit, a sense device, formed in the semiconductor switching device, and an overcurrent detecting portion, formed in the semiconductor driving circuit.

The sense device is constituted of a sense terminal, through which a current proportional to a main current of the semiconductor switching device flows, and a sense resistor, connected between a main terminal of the semiconductor switching device and the sense terminal and performing voltage conversion of the sense current. Also, the overcurrent detecting portion detects the sense current flowing through the sense device and, when the sense current exceeds a predetermined value, turns off the semiconductor switching device to protect the semiconductor switching device from an overcurrent.

SUMMARY

The overcurrent protection method of Patent Document 1 is a method where the semiconductor switching device is turned off based on the sense current and is therefore easily influenced by noise, and at times, a sense current containing noise is erroneously detected as an overcurrent.

On the other hand, it may be considered to form a diode on a front surface of a semiconductor substrate and use the diode as a temperature sense device. When a temperature change occurs at the front surface side of the semiconductor substrate, a characteristic (voltage value, etc.) of the diode changes accordingly. The temperature change of the semiconductor substrate can thus be detected by monitoring the change of the characteristic of the diode.

However, to form the diode on the front surface of the semiconductor substrate, a manufacturing process must be added and manufacturing cost increases. Also, due to formation of a step between a front surface of the diode and the front surface of the semiconductor substrate, there are cases where exposure focus is not achieved when forming an impurity region of the diode and variations occur in dimensions of the impurity region of the diode.

An object of the present invention is to provide a semiconductor device that can be prepared easily with high precision and a method for manufacturing the same.

BRIEF DESCRIPTION OF THE DRAWINGS

For a more complete understanding, reference is now made to the following description taken in conjunction with the accompanying Drawings in which:

FIG. 8A to FIG. 8C are diagrams showing a portion of a manufacturing process of the semiconductor device.

FIG. 9A to FIG. 9C are each a diagram showing a step after that of FIG. 8A to FIG. 8C.

FIG. 10A to FIG. 10C are each a diagram showing a step after that of FIG. 9A to FIG. 9C.

FIG. 11A to FIG. 11C are each a diagram showing a step after that of FIG. 10A to FIG. 10C.

FIG. 12A to FIG. 12C are each a diagram showing a step after that of FIG. 11A to FIG. 11C.

FIG. 13A to FIG. 13C are each a diagram showing a step after that of FIG. 12A to FIG. 12C.

FIG. 14A to FIG. 14C are each a diagram showing a step after that of FIG. 13A to FIG. 13C.

FIG. 16 is a schematic view of a package that includes the semiconductor device.

DETAILED DESCRIPTION

Figure 1:
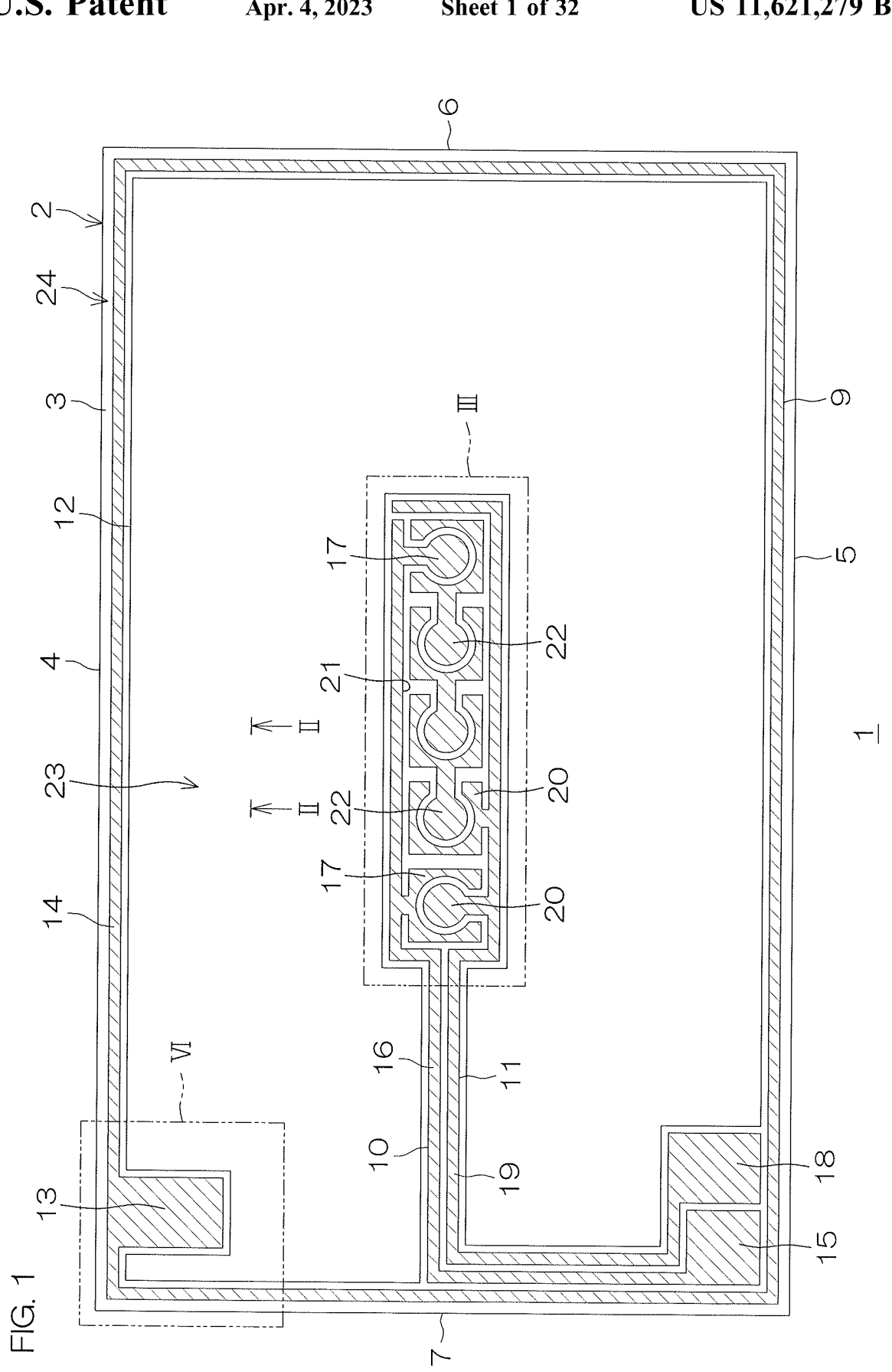
FIG. 1 is a schematic plan view of a semiconductor device according to a preferred embodiment of the present invention.

A semiconductor device according to a preferred embodiment of the present invention includes a semiconductor layer, a transistor cell portion, formed in the semiconductor layer, a first trench, formed in the semiconductor layer, a diode, electrically separated from the transistor cell portion and having a first conductivity type portion and a second conductivity type portion disposed inside the first trench, a second trench, formed in the semiconductor layer, and a bidirectional Zener diode, electrically connected to the transistor cell portion and having a pair of first conductivity type portions, disposed inside the second trench, and at least one second conductivity type portion, formed between the pair of first conductivity type portion.

According to this arrangement, the diode is disposed inside the first trench that is formed in the semiconductor layer. Exposure focus can thus be achieved with high precision when forming the first conductivity type portion and the second conductivity type portion of the diode. Consequently, dimensional variations of the first conductivity type portion and the second conductivity type portion of the diode can be suppressed.

Similarly, the bidirectional Zener diode is disposed inside the second trench that is formed in the semiconductor layer. Exposure focus can thus be achieved with high precision when forming the first conductivity type portions and the second conductivity type portion of the bidirectional Zener diode. Consequently, dimensional variations of the first conductivity type portions and the second conductivity type portion of the bidirectional Zener diode can be suppressed.

The semiconductor device according to the preferred embodiment of the present invention may include a first insulating film, formed between an inner surface of the first trench and the diode, and the first insulating film may include a first portion, disposed at a bottom surface of the first trench, and a second portion, formed thicker than the first portion of the insulating film and disposed at a side surface of the first trench.

In the semiconductor device according to the preferred embodiment of the present invention, the diode may include the first conductivity type portion, which is formed to an annular shape in plan view, and the second conductivity type portion, which is formed in a region surrounded by the first conductivity type portion.

In the semiconductor device according to the preferred embodiment of the present invention, the second conductivity type portion of the diode may be formed to a circular shape in plan view.

In the semiconductor device according to the preferred embodiment of the present invention, a plurality of the diodes may be provided in a mutually electrically connected mode and the plurality of diodes may include one first diode and a plurality of second diodes, connected in parallel to the first diode and connected serially to each other.

In the semiconductor device according to the preferred embodiment of the present invention, the transistor cell portion may include a gate trench, a first conductivity type source region, formed at a side of the gate trench and exposed at a front surface of the semiconductor layer, a second conductivity type body region, formed at the side of the gate trench such that the body region is in contact with the source region, a first conductivity type drain region, formed at the side of the gate trench such that the drain region is in contact with the body region, a gate insulating film, formed on an inner surface of the gate trench, and a gate electrode, embedded in the gate trench via the gate insulating film, and the diode and the bidirectional Zener diode may be constituted of the same material as the gate electrode.

According to this arrangement, the gate trench, the first trench, and the second trench can be formed in the same step and therefore increase of manufacturing steps accompanying the forming of the diode and the bidirectional Zener diode can be suppressed.

In the semiconductor device according to the preferred embodiment of the present invention, the gate electrode, the diode, and the bidirectional Zener diode may be constituted of polysilicon.

In the semiconductor device according to the preferred embodiment of the present invention, the gate trench, the first trench, and the second trench may have the same depth as each other.

In the semiconductor device according to the preferred embodiment of the present invention, the gate insulating film may include a first portion, disposed at a side surface of the gate trench and a second portion, formed thicker than the first portion of the gate insulating film and disposed at a bottom surface of the gate trench.

The semiconductor device according to the preferred embodiment of the present invention may include a source trench, passing through the source region and the body region from the front surface of the semiconductor layer and reaching the drain region, an insulating film formed on an inner surface of the source trench such that the source region and the body region are exposed from the insulating film, and a conductive body, embedded in the source trench via the insulating film and constituted of the same material as the gate electrode.

The semiconductor device according to the preferred embodiment of the present invention may further include a second conductivity type impurity region formed at a bottom portion of the source trench.

In the semiconductor device according to the preferred embodiment of the present invention, the gate trench, the first trench, the second trench, and the source trench may have the same depth as each other.

The semiconductor device according to the preferred embodiment of the present invention may include a second insulating film, formed between an inner surface of the second trench and the bidirectional Zener diode, and the second insulating film may include a first portion, disposed at a bottom surface of the second trench, and a second portion, formed thicker than the first portion of the second insulating film and disposed at a side surface of the second trench.

In the semiconductor device according to the preferred embodiment of the present invention, one of the pair of first conductivity type portions of the bidirectional Zener diode may be electrically connected to the gate electrode and the other of the pair of first conductivity type portions may be electrically connected to the source region.

A method for manufacturing a semiconductor device according to a preferred embodiment of the present invention includes a step of forming a gate trench, a first trench, and a second trench in a semiconductor layer, a step of forming mutually continuous insulating films on an inner surface of the gate trench, an inner surface of the first trench, and an inner surface of the second trench, a step of depositing a semiconductor material on the semiconductor layer to embed, via the insulating layer, the semiconductor material in each of the gate trench, the first trench, and the second trench, a step of selectively implanting a first conductivity type impurity and a second conductivity type impurity into a side of the gate trench to form a first conductivity type source region, a second conductivity type body region, and a first conductivity type drain region in that order from a front surface of the semiconductor layer and along a side surface of the gate trench, a step of selectively implanting the first conductivity type impurity and the second conductivity type impurity into the semiconductor material inside the first trench to form a diode having a first conductivity type portion and a second conductivity type portion, and a step of selectively implanting the first conductivity type impurity and the second conductivity type impurity into the semiconductor material inside the second trench to form a bidirectional Zener diode having a pair of first conductivity type portions and at least one second conductivity type portion, formed between the pair of first conductivity type portions.

According to this method, the exposure focus can be achieved with high precision when selectively implanting the first conductivity type impurity and the second conductivity type impurity into the semiconductor material inside the first trench and when selectively implanting the first conductivity type impurity and the second conductivity type impurity into the semiconductor material inside the second trench. Consequently, dimensional variations of the first conductivity type portion and the second conductivity type of the diode and dimensional variations of the first conductivity type portions and the second conductivity type portion of the bidirectional Zener diode can be suppressed.

Also, the gate trench, the first trench, and the second trench can be formed in the same step and therefore increase of manufacturing steps accompanying the forming of the diode and the bidirectional Zener diode can be suppressed.

A preferred embodiment of the present invention shall now be described in detail with reference to the attached drawings.

FIG. 1 is a schematic plan view of a semiconductor device 1 according to a preferred embodiment of the present invention.

The semiconductor device 1 is, for example, a discrete semiconductor device and is arranged as a MISFET (metal insulator semiconductor field effect transistor) in the present preferred embodiment. The semiconductor device 1 includes a semiconductor substrate 2. The semiconductor substrate 2 may be formed to a quadrilateral shape in plan view. In the present preferred embodiment, the semiconductor substrate 2 is formed to a rectangular shape, having a pair of long sides and a pair of short sides, in plan view.

In the semiconductor substrate 2, a region surrounded by the pair of long sides and the pair of short sides is a first surface 3 of the semiconductor substrate 2. The first surface 3 of the semiconductor substrate 2 may be referred to as a front surface of the semiconductor substrate 2. Also, a surface at the opposite side (see FIG. 2) of the first surface 3 of the semiconductor substrate 2 is a second surface 4. The second surface 4 of the semiconductor substrate 2 may be referred to as a rear surface of the semiconductor substrate 2.

Also, surfaces defining the pair of long sides of the semiconductor substrate 2 are a third surface 5 and a fourth surface 6. The third surface 5 and the fourth surface 6 face each other. On the other hand, surfaces defining the pair of short sides of the semiconductor substrate 2 are a fifth surface 7 and a sixth surface 8. The fifth surface 7 and the sixth surface 8 face each other. The third surface 5, the fourth surface 6, the fifth surface 7 and the sixth surface 8 of the semiconductor substrate 2 connect the first surface 3 and the second surface 4 to each other. Also, the third surface 5, the fourth surface 6, the fifth surface 7 and the sixth surface 8 of the semiconductor substrate 2 may be referred to as side surfaces of the semiconductor substrate 2. Also a region of the first surface 3 of the semiconductor substrate 2 in a vicinity of the third surface 5, the fourth surface 6, the fifth surface 7 and the sixth surface 8 may be referred to as a peripheral edge portion of the semiconductor substrate 2.

A plurality of mutually separated conductive patterns are formed on the first surface 3 of the semiconductor substrate 2. The plurality of conductive patterns may each be constituted of an alloy containing Al, such as AlCu, AlSiCu, etc. In the present preferred embodiment, the plurality of conductive patterns may include a gate conductive film 9, an anode conductive film 10, a cathode conductive film 11, and a source conductive film 12. In FIG. 1, hatching is applied to the gate conductive film 9, the anode conductive film 10, and the cathode conductive film 11 for the sake of clarity.

The gate conductive film 9 may include a gate pad 13 and a gate finger 14. In the present preferred embodiment, the gate pad 13 is disposed at one corner portion of the semiconductor substrate 2 in plan view. In plan view, the gate finger 14 extends such that the gate finger 14 lies along (for example, to be in parallel to) the third surface 5, the fourth surface 6, the fifth surface 7 and the sixth surface 8 of the semiconductor substrate 2 from the gate pad 13. In the present preferred embodiment, the gate finger 14 is formed to an annular shape over an entirety of the peripheral edge portion of the semiconductor substrate 2.

The anode conductive film 10 may include an anode pad 15, an anode finger 16, and anode electrodes 17. Also, the cathode conductive film 11 may include a cathode pad 18, a cathode finger 19, and cathode electrodes 20. The anode conductive film 10 and the cathode conductive film 11 are formed in a region surrounded by the gate finger 14. The region surrounded by the gate finger 14 may be referred to as an active region 23 of the semiconductor substrate 2, and a region in which the gate finger 14 is formed and a region further outside this region may be referred to as an outer peripheral region 24 of the semiconductor substrate 2.

In the present preferred embodiment, the anode pad 15 and the cathode pad 18 are disposed alongside each other at one corner portion of the semiconductor substrate 2 differing from the corner portion at which the gate pad 13 is disposed. More specifically, the gate pad 13 is disposed at one end portion of one short side (the short side defined by the fifth surface 7 in FIG. 1) of the semiconductor substrate 2 and the anode pad 15 and the cathode pad 18 are disposed at the other end portion of this short side.

The anode finger 16 and the cathode finger 19 extend from the anode pad 15 and the cathode pad 18, respectively, such that the anode finger 16 and the cathode finger 19 lie along the fifth surface 7 of the semiconductor substrate 2 and bend toward a central portion of the semiconductor substrate 2 at an intermediate portion of the short side of the semiconductor substrate 2. The anode finger 16 and the cathode finger 19 are disposed in parallel to each other from the anode pad 15 and the cathode pad 18 to the central portion of the semiconductor substrate 2. The anode finger 16 and the cathode finger 19 are apart from each other at the central portion of the semiconductor substrate 2 and demarcate an electrode region 21 of predetermined area. That is, the electrode region 21 is a region in the central portion of the semiconductor substrate 2 that is surrounded by the anode finger 16 and the cathode finger 19.

The anode finger 16 and the cathode finger 19 are disposed to face each other across the electrode region 21. The anode electrodes 17 extend toward the cathode finger 19 from the anode finger 16 and are disposed inside the electrode region 21. Similarly the cathode electrodes 20 extend toward the anode finger 16 from the cathode finger 19 and are disposed inside the electrode region 21.

Also, in the present preferred embodiment, diode wirings 22 are formed as conductive patterns besides the anode electrodes 17 and the cathode electrodes 20. The diode wirings 22 are separated from the anode electrodes 17 and the cathode electrodes 20.

The source conductive film 12 is formed such that the source conductive film 12 covers substantially an entirety of the active region 23 excluding regions in which the anode conductive film 10 and the cathode conductive film 11 are formed.

Although omitted in FIG. 1, a passivation film 68 (see FIG. 5 and FIG. 7) may be formed on the first surface 3 of the semiconductor substrate 2 such that the passivation film 68 covers the conductive patterns, such as the gate conductive film 9, the anode conductive film 10, the cathode conductive film 11, the source conductive film 12, etc. The plurality of conductive patterns may be covered by the passivation film 68 with the exclusion of exposure of portions of the gate pad 13, the anode pad 15, the cathode pad 18, and the source conductive film 12 for securing regions for wire bonding.

Also, in the description of FIG. 1, an arrangement "formed on the first surface 3 of the semiconductor substrate 2" shall include, in addition to an arrangement formed directly on the first surface 3 of the semiconductor substrate 2, an arrangement formed sandwiching one or a plurality of other layers with the semiconductor substrate 2 and is simply disposed inside the region of the first surface 3 of the semiconductor substrate 2.

Figure 2:
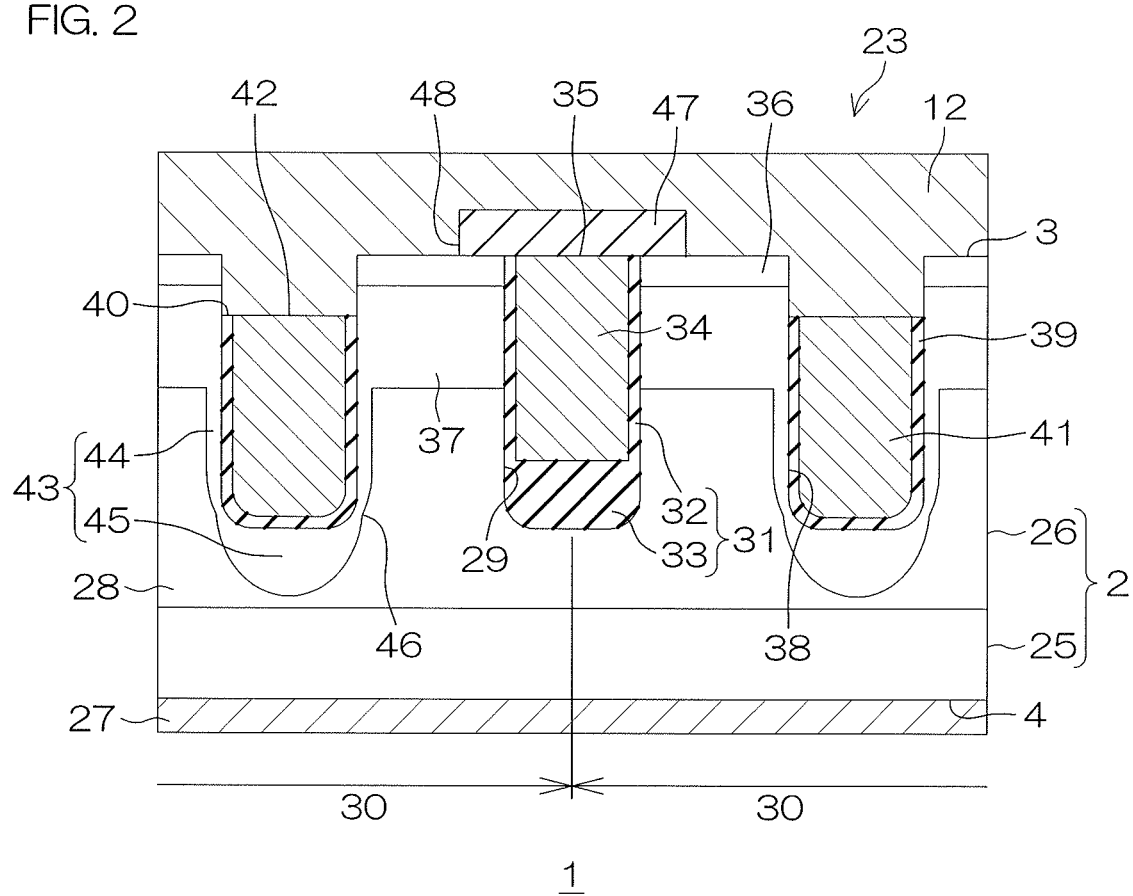
FIG. 2 is a sectional view taken along line II-II of FIG. 1.

FIG. 2 is a sectional view taken along line II-II of FIG. 1 and is a diagram for describing a transistor structure of the semiconductor device 1.

A specific structure of the MISFET included in the active region 23 of the semiconductor substrate 2 shall now be described with reference to FIG. 2.

The semiconductor substrate 2 includes a base substrate 25 and an epitaxial layer 26 formed on the base substrate 25. The base substrate 25 may be an n+ type semiconductor layer made of silicon. The epitaxial layer 26 may be an n− type semiconductor layer made of silicon. The first surface 3 of the semiconductor substrate 2 is formed by the epitaxial layer 26 and the second surface 4 of the semiconductor substrate 2 is formed by the base substrate 25.

An n type impurity concentration of the base substrate 25 may, for example, be $1.0\times1019$ cm-3 to $1.0\times1020$ cm-3. An n type impurity concentration of the epitaxial layer 26 may, for example, be $1.0\times1015$ cm-3 to $1.0\times1017$ cm-3.

A drain electrode 27 is connected to the second surface 4 of the semiconductor substrate 2. The n type base substrate 25 and epitaxial layer 26 are thereby formed as an n type drain region 28. As a material of the drain electrode 27, for example, the same material as that of the plurality of conductive patterns, such as the gate conductive film 9, etc., may be applied.

Gate trenches 29 are formed in the semiconductor substrate 2. A depth of the gate trenches 29 is, for example, 0.5 μm to 1.5 μm. The gate trenches 29 demarcate unit cells 30 of the MISFET. The gate trenches 29 are formed in the first surface 3 of the semiconductor substrate 2. The gate trenches 29 may be formed in stripes in plan view or may be formed in a lattice in plan view. A cell pitch of the unit cells 30 that is defined by a distance between adjacent gate trenches 29 may, for example, be 1.0 μm to 2.0 μm. Such unit cells 30 are formed over an entirety of the region covered by the source conductive film 12 of FIG. 1.

A gate insulating film 31 is formed on an inner surface of each gate trench 29. The gate insulating film 31 may, for example, be constituted of an insulating material, such as silicon oxide (SiO2), etc. The gate insulating film 31 includes a first portion 32, disposed at a side surface of the gate trench 29, and a second portion 33, formed thicker than the first portion 32 of the gate insulating film 31 and disposed at a bottom surface of the gate trench 29. A thickness of the first portion 32 may, for example, be 300 Å to 1500 Å, and a thickness of the second portion 33 may, for example, be 1500 Å to 4000 Å.

A gate electrode 34 is embedded in the gate trench 29 via the gate insulating film 31. The gate electrode 34 may be constituted, for example, of a conductive material, such as polysilicon, etc. The gate electrode 34 has an upper surface 35 that is flush with the first surface 3 of the semiconductor substrate 2. The gate electrode 34 is electrically connected to the gate finger 14 in a vicinity of a boundary between the source conductive film 12 and the gate finger 14 in FIG. 1.

At each side of the gate trench 29, a source region 36, a body region 37, and the drain region 28 are formed in that order from the first surface 3 toward the second surface 4 of the semiconductor substrate 2. The source region 36 and the body region 37 may respectively be an n type semiconductor region and a p type semiconductor region. An n type impurity concentration of the source region 36 may, for example, be $1.0\times1019$ cm-3 to $1.0\times1020$ cm-3. A p type impurity concentration of the body region 37 may, for example, be $1.0\times1015$ cm-3 to $1.0\times1017$ cm-3.

That is, the source region 36 is formed at a frontmost surface of the semiconductor substrate 2 and is exposed from the first surface 3. The body region 37 is sandwiched between the source region 36 and the drain region 28. The source region 36, the body region 37, and the drain region 28 are exposed as the inner surface of the gate trench 29. The gate electrode 34 is disposed across the source region 36, the body region 37, and the drain region 28 and faces all of the source region 36, the body region 37, and the drain region 28.

Further in the present preferred embodiment, source trenches 38 are formed in the semiconductor substrate 2. Each source trench 38 is formed such that each source trench 38 passes through the source region 36 and the body region 37 from the first surface 3 of the semiconductor substrate 2 and reach the drain region 28. A depth of the source trench 38 may, for example, be the same as that of the gate trenches 29. The depth of the source trench 38 may thus, for example, be 0.5 μm to 1.5 μm. The source region 36 and the body region 37 are exposed as a side surface of the source trench 38.

An insulating film 39 is formed on an inner surface of the source trench 38. The insulating film 39 may, for example, be constituted of an insulating material, such as silicon oxide (SiO2), etc. A thickness of the insulating film 39 may be a uniform thickness over an entirety of the insulating film 39. In the present preferred embodiment, the thickness of the insulating film 39 may be the same as that of the first portion 32 of the gate insulating film 31. Also, the insulating film 39 may be formed selectively on a portion of the inner surface of the source trench 38 such that the source region 36 and the body region 37 are exposed to the side surface of the source trench 38. That is, the insulating film 39 has an upper end portion 40 at a position (an intermediate portion of the body region 37) that is receded in a depth direction of the source trench 38 with respect to the first surface 3 of the semiconductor substrate 2.

A conductive body 41 is embedded in the source trench 38 via the insulating film 39. The conductive body 41 may, for example, be constituted of the same material (for example, polysilicon) as the gate electrode 34. In the source trench 38, the conductive body 41 is formed just in an inner region of the insulating film 39 and, in the present preferred embodiment, is embedded in the source trench 38 such that the conductive body 41 has an upper surface 42 that is flush with the upper end portion 40 of the insulating film 39. The upper surface 42 of the conductive body 41 is thus positioned at bottom portion sides of the gate trench 29 and the source trench 38 with respect to the upper surface 35 of the gate electrode 34.

An impurity region 43 is formed in a periphery of the source trench 38. The impurity region 43 may be a p type impurity region. A p type impurity concentration of the impurity region 43 may, for example, be $1.0\times1015$ cm-3 to $1.0\times1017$ cm-3.

In the present preferred embodiment, the impurity region 43 is formed continuous to the body region 37 and is exposed to the inner surface of the source trench 38. More specifically, the impurity region 43 may integrally have a first portion 44, extending along the side surface of the source trench 38 from the body region 37 toward the bottom portion of the source trench 38, and a second portion 45, extending toward the second surface 4 of the semiconductor substrate 2 from a bottom surface of the source trench 38.

The first portion 44 of the impurity region 43 has a uniform thickness in a direction orthogonal to the depth direction of the source trench 38 from the side surface of the source trench 38. The thickness may, for example, be approximately 0.2 μm.

On the other hand, the second portion 45 of the impurity region 43 is not uniform in thickness in a direction toward the second surface 4 of the semiconductor substrate 2 from the bottom surface of the source trench 38. More specifically, the second portion 45 is formed to an arc shape in sectional view that projects toward the second surface 4 of the semiconductor substrate 2 with a position directly below a central portion in a width direction of the source trench 38 as an apex. The thickness of the second portion 45 is thus of a magnitude that gradually increases from both end portions toward the central portion in the width direction of the source trench 38. For example, the greatest thickness (thickness of the apex of the arc shape) of the second portion 45 may, for example, be approximately 0.4 μm.

Also, in the impurity region 43, a recess 46 recessed toward a corner portion of the bottom portion of the source trench 38 may be formed at a boundary portion between the first portion 44 and the second portion 45.

An insulating layer 47, covering the unit cells 30, is formed on the first surface 3 of the semiconductor substrate 2. The insulating layer 47 may, for example, have a laminated structure, in which a plurality of insulating films are laminated, or may have a single layer structure that includes just a single insulating film. The insulating layer 47 may contain, for example, silicon oxide (SiO2) or silicon nitride (SiN).

Contact holes 48 are formed in the insulating layer 47. Each contact hole 48 exposes, from the insulating layer 47, a source trench 38 and the source region 36 at a periphery of the source trench 38 in the first surface 3 of the semiconductor substrate 2.

The source conductive film 12 is formed on the insulating layer 47. From above the insulating layer 47, the source conductive film 12 enters into the contact holes 48 and enters into the source trenches 38. The source conductive film 12 contacts the source region 36 and the body region 37 at the side surface of the each source trench 38 and contacts the source region 36 at the first surface 3 of the semiconductor substrate 2. The source conductive film 12 is thereby electrically connected to the source region 36 and the body region 37.

Also, in the present preferred embodiment, the source conductive film 12 is electrically connected to the conductive body 41 inside the source trench 38. More specifically, the upper surface 42 of the conductive body 41 is exposed in the source trench 38 and the source conductive film 12 is embedded in the source trench 38 such that the source conductive film 12 is in contact with the upper surface 42 of the conductive body 41.

Figure 3:
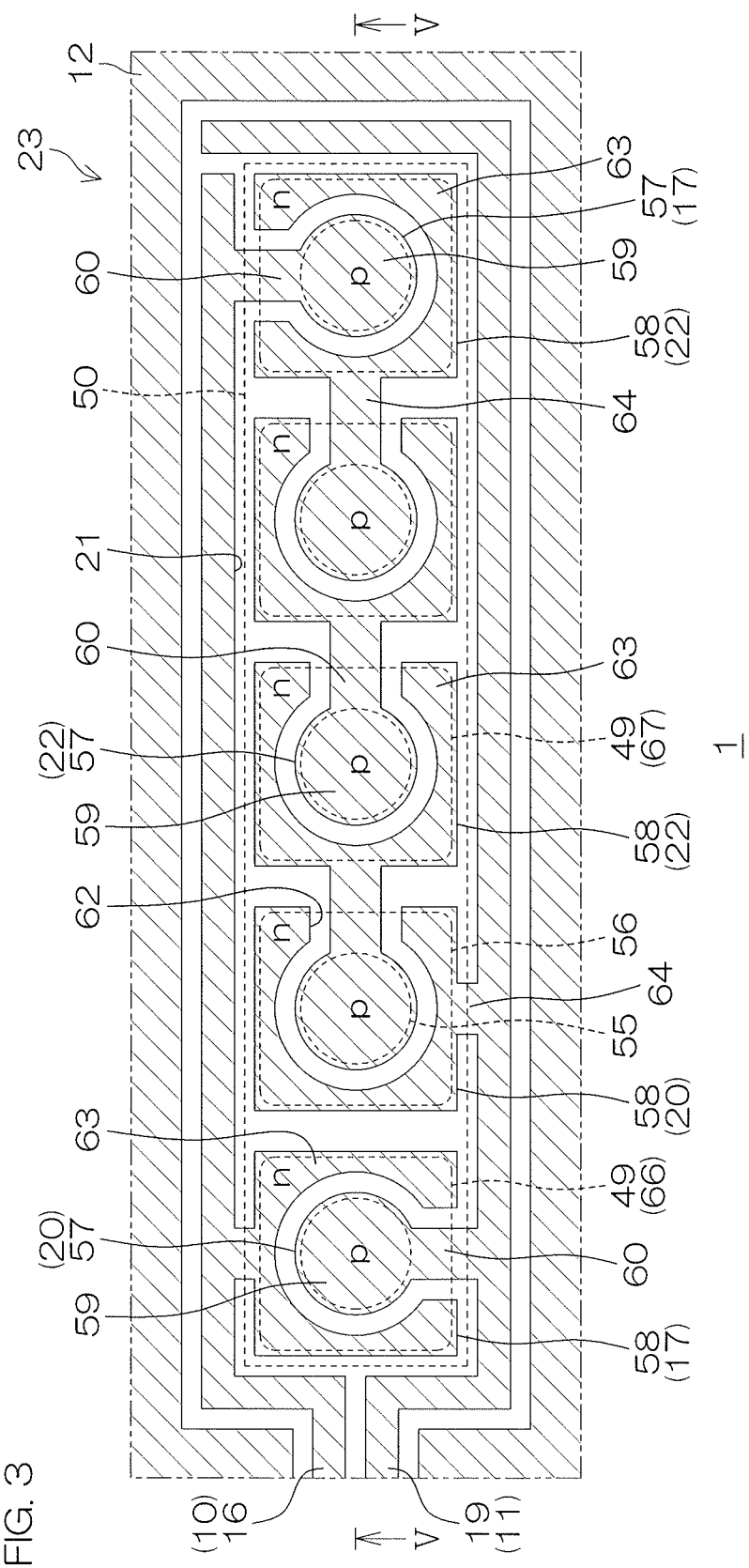
FIG. 3 is an enlarged view of a portion surrounded by alternate long and two short dashes lines III of FIG. 1.
Figure 4:
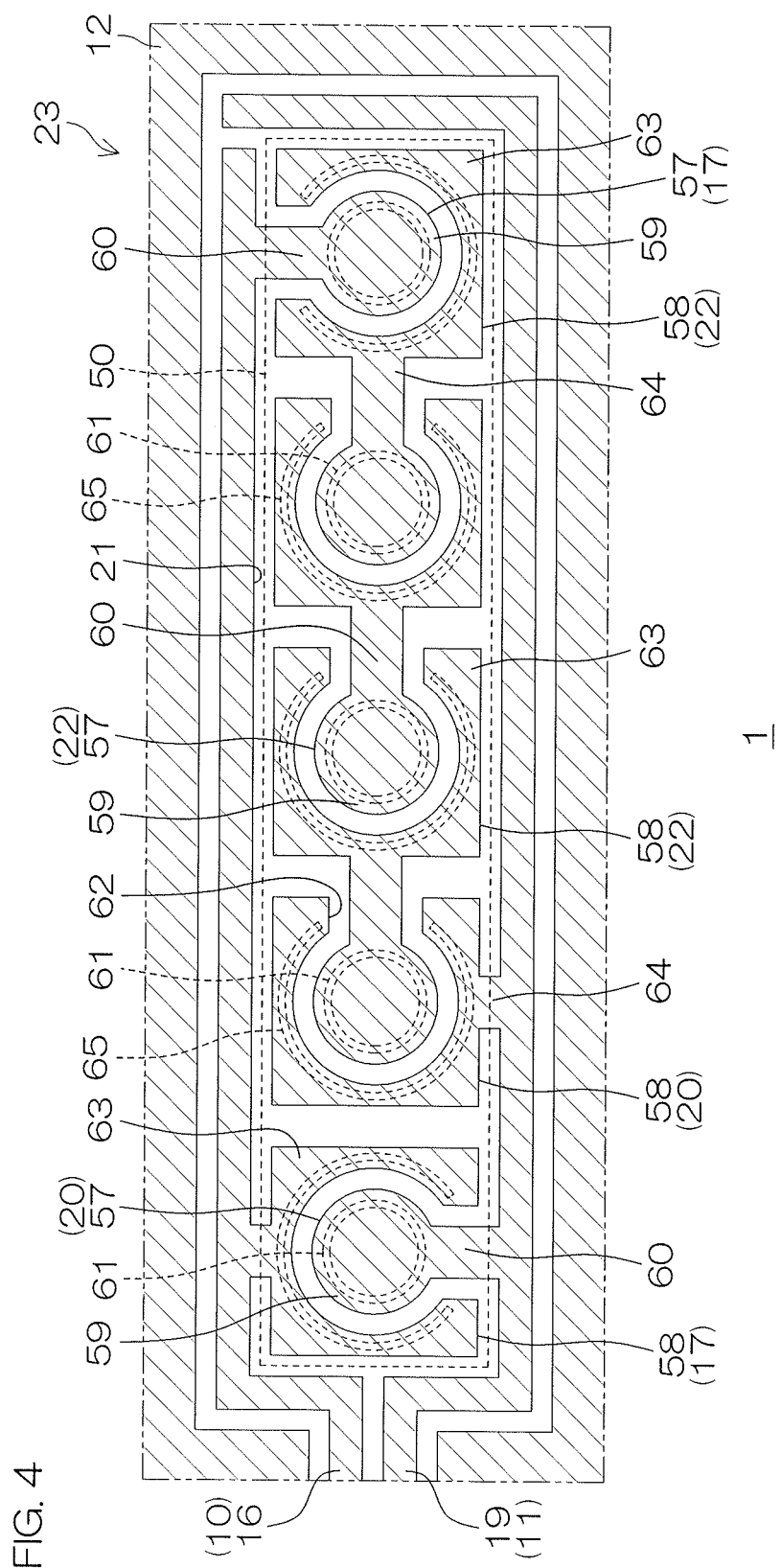
FIG. 4 is an enlarged view of the portion surrounded by the alternate long and two short dashes lines III of FIG. 1.
Figure 5:
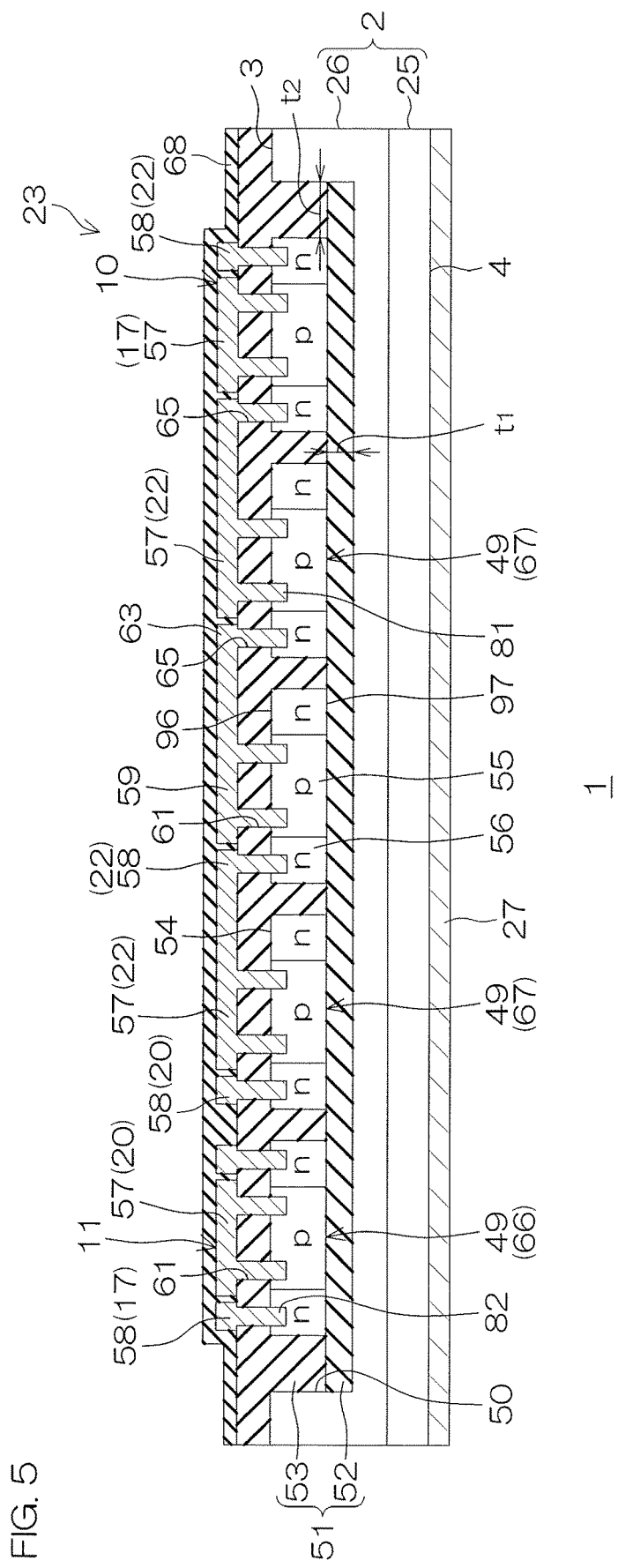
FIG. 5 is a sectional view taken along line V-V of FIG. 3.

FIG. 3 is an enlarged view of a portion surrounded by alternate long and two short dashes lines III of FIG. 1. FIG. 4 is an enlarged view of the portion surrounded by the alternate long and two short dashes lines III of FIG. 1. FIG. 5 is a sectional view taken along line V-V of FIG. 3.

A specific structure of diodes 49 included in the active region 23 of the semiconductor substrate 2 shall now be described with reference to FIG. 3 to FIG. 5. FIG. 3 mainly shows shapes of the anode conductive film 10 and the cathode conductive film 11 and planar shapes of the diodes 49. FIG. 4 mainly shows the shapes of the anode conductive film 10 and the cathode conductive film 11 and shapes of contact of the conductive films 10 and 11 and the diodes 49. FIG. 5 mainly shows cross-sectional shapes of the diodes 49.

A first trench 50 is formed in the epitaxial layer 26 of the semiconductor substrate 2. A depth of the first trench 50 may, for example, be the same as that of the gate trenches 29. Therefore, the depth of the first trench 50 may, for example, be 0.5 μm to 1.5 μm. Also, as shown in FIG. 5, the first trench 50 has a bottom portion at the first surface 3 side (that is, inside the epitaxial layer 26) of the semiconductor substrate 2 with respect to an interface between the base substrate 25 and the epitaxial layer 26.

As shown in FIG. 3 and FIG. 4, the first trench 50 is formed independently of the gate trenches 29 in a region that is not covered by the source conductive film 12. In the present preferred embodiment, the first trench 50 is formed to a quadrilateral shape in plan view. Due to the gate trenches 29 being formed over the entirety of the region covered by the source conductive film 12, the first trench 50 is adjacent to many unit cells 30 inside the active region 23.

The diodes 49 are disposed inside the first trench 50. By a first insulating film 51 being formed on inner surfaces between the diodes 49 and the first trench 50, the diodes 49 and the semiconductor substrate 2 are insulated from each other.

The first insulating film 51 may, for example, be constituted of an insulating material, such as silicon oxide (SiO2), etc. The first insulating film 51 may include a first portion 52, formed on a bottom surface of the first trench 50, and a second portion 53, covering the diodes 49 and embedded in a portion of the first trench 50 higher than the first portion 52.

The first portion 52 of the first insulating film 51 is formed to a uniform thickness over an entirety of the bottom surface of the first trench 50 and the thickness t1 may, for example, be 1500 Å to 4000 Å.

And the diodes 49 are disposed on the first insulating film 51. The diodes 49 may be constituted of the same material as the gate electrode 34 (polysilicon in the present preferred embodiment). In the present preferred embodiment, a plurality of the diodes 49 (five in FIG. 3 to FIG. 5) are disposed at intervals from each other in the single first trench 50. The plurality of diodes 49 may, for example, be aligned along a length direction of the first trench 50 of rectangular shape in plan view.

Also, each diode 49 is formed across an interval from a side surface of the first trench 50. The plurality of diodes 49 are thus disposed inside a region surrounded by the side surface of the first trench 50. A distance between a side surface of each diode 49 and the side surface of the first trench 50 is greater than a thickness of each diode 49. For example, the distance between the side surface of each diode 49 and the side surface of the first trench 50 may be 5 μm to 15 μm and the thickness of each diode 49 may be 3000 Å to 8000 Å.

As shown in FIG. 5, each diode 49 has an upper surface 54 (flat surface) that is flush with the first surface 3 of the semiconductor substrate 2. The upper surface 54 of each diode 49 may be parallel to the bottom surface of the first trench 50.

In the present preferred embodiment, each diode 49 includes a p type portion 55 and an n type portion 56 surrounding the p type portion 55. For example, the p type portion 55 is formed to a circular shape in plan view, and the n type portion 56 is formed to an annular shape in plan view.

Also, as long as the arrangement is one where the p type portion 55 is surrounded by the n type portion 56, the p type portion 55 and the n type portion are not overlapped in plan view and therefore contact with either of the p type portion 55 and the n type portion can be made easily without requiring a separate routing wiring, etc.

The p type portion 55 and the n type portion 56 may respectively formed such that the p type portion 55 and the n type portion 56 reach a rear surface 97 from a front surface 96 in a thickness direction of a polysilicon layer as shown in FIG. 5 or, although not illustrated, may be formed selectively at a front surface portion of the polysilicon layer. The p type portion 55 does not have to be surrounded by the n type portion 56 and, for example, the p type portion 55 and the n type portion 56 may be formed adjacent to each other such that the p type portion 55 and the n type portion 56 partially have a peripheral edge that is not shared.

Also, the p type impurity concentration of the p type portion 55 may, for example, be $1 \times 10^{15}$ cm-3 to $1 \times 10^{20}$ cm-3. The n type impurity concentration of the n type portion 56 may, for example, be $1 \times 10^{18}$ cm-3 to $1 \times 10^{21}$ cm-3.

As shown in FIG. 5, the second portion 53 of the first insulating film 51 completely fills portions between adjacent diodes 49 and between the diodes 49 and the side surface of the first trench 50 and is formed on the semiconductor substrate 2 such that the second portion 53 of the first insulating film 51 covers the diodes 49.

A thickness t2 of a portion of the second portion 53 on the side surface of the first trench 50 (portion in contact with the side surface of the first trench 50) is thicker than the thickness t1 of the first portion 52 and may, for example, be 5 μm to 15 μm.

And the anode electrodes 17, the cathode electrodes 20, and the diode wirings 22 are formed on the second portion 53 of the first insulating film 51 and are respectively electrically connected to the diodes 49. As shown in FIG. 3 and FIG. 4, each of the anode electrodes 17, the cathode electrodes 20, and the diode wirings 22 may either be a first electrode 57, having a first shape connected to the p type portion 55 of a diode 49, or a second electrode 58, having a second shape connected to the n type portion 56 of a diode 49.

In the present preferred embodiment, the first electrode 57 integrally includes a first contact portion 59 of circular shape in plan view that is oriented along the p type portion 55 of circular shape in plan view and a first lead-out portion 60 of line shape extending from the first contact portion 59. As shown in FIG. 4 and FIG. 5, the first contact portion 59 is connected to the p type portion 55 via an annular first contact hole 61 formed in the insulating film 51 (second portion 53) above the p type portion 55. As shown in FIG. 5, the first contact portion 59 may be embeddedly connected to a front surface portion of the p type portion 55, for example, by a first plug 81, constituted of a conductive material, such as tungsten (W), etc.

In the present preferred embodiment, the second electrode 58 integrally includes a second contact portion 63 of substantially annular shape in plan view having an open portion 62 at a portion and a second lead-out portion 64 of line shape extending from the second contact portion 63. As shown in FIG. 4 and FIG. 5, the second contact portion 63 is connected to the n type portion 56 via a second contact hole 65, being of a partially-open, substantially annular shape in plan view as is the second contact portion 63 and formed in the insulating film 51 (second portion 53) above the n type portion 56. As shown in FIG. 5, the second contact portion 63 may be embeddedly connected to a front surface portion of the n type portion 56, for example, by a second plug 82, constituted of a conductive material, such as tungsten (W), etc.

And in the present preferred embodiment, a cathode electrode 20, constituted of a first electrode 57, is connected to the p type portion 55 of one diode 49 (the diode 49 at a left side of the sheet in each of FIG. 3 to FIG. 5) among the plurality of diodes 49 that are at intervals from each other. To the n type portion 56 of the diode 49 is connected an anode electrode 17 constituted of a second electrode 58. The cathode electrode 20 (first contact portion 59) is surrounded by the anode electrode 17 (second contact portion 63).

On the other hand, an anode electrode 17, constituted of a first electrode 57, is connected to the p type portion 55 of one diode 49 (the diode 49 at the right side of the sheet in each of FIG. 3 to FIG. 5) that is disposed across at least one diode 49 from the diode 49 at the left side of the sheet. To the n type portion 56 of the diode 49 is connected a diode wiring 22, constituted of a second electrode 58. A diode wiring 22, constituted of a first electrode 57 that is continuous to the second electrode 58 of the aforementioned diode wiring 22, is connected to the p type portion 55 of a diode 49 adjacent the aforementioned diode 49. Such an arrangement is also applied to a further adjacent diode 49.

And a diode wiring 22, constituted of a first wiring 57, is connected to the p type portion 55 of a diode 49 adjacent to the diode 49 at the left side of the sheet. To the n type portion 56 of the diode 49 is connected a cathode electrode 20, constituted of a second electrode 58.

Thereby in the present preferred embodiment, adjacent diodes 49 are electrically connected to each other by diode wirings 22 that span across the adjacent diodes 49 by a first electrode 57 and a second electrode 58 being integrated. And the plurality of diodes 49 include one first diode 66 (in the present preferred embodiment, the diode 49 at the left side of the sheet) and a plurality (four, in the present preferred embodiment) of second diodes 67 that are connected in parallel to the first diode 66 and connected serially to each other.

The passivation film 68 is formed on the first insulating film 51 such that the passivation film 68 covers the anode electrodes 17, the cathode electrodes 20, and the diode wirings 22. The passivation film 68 may contain, for example, silicon nitride (SiN).

Figure 6:
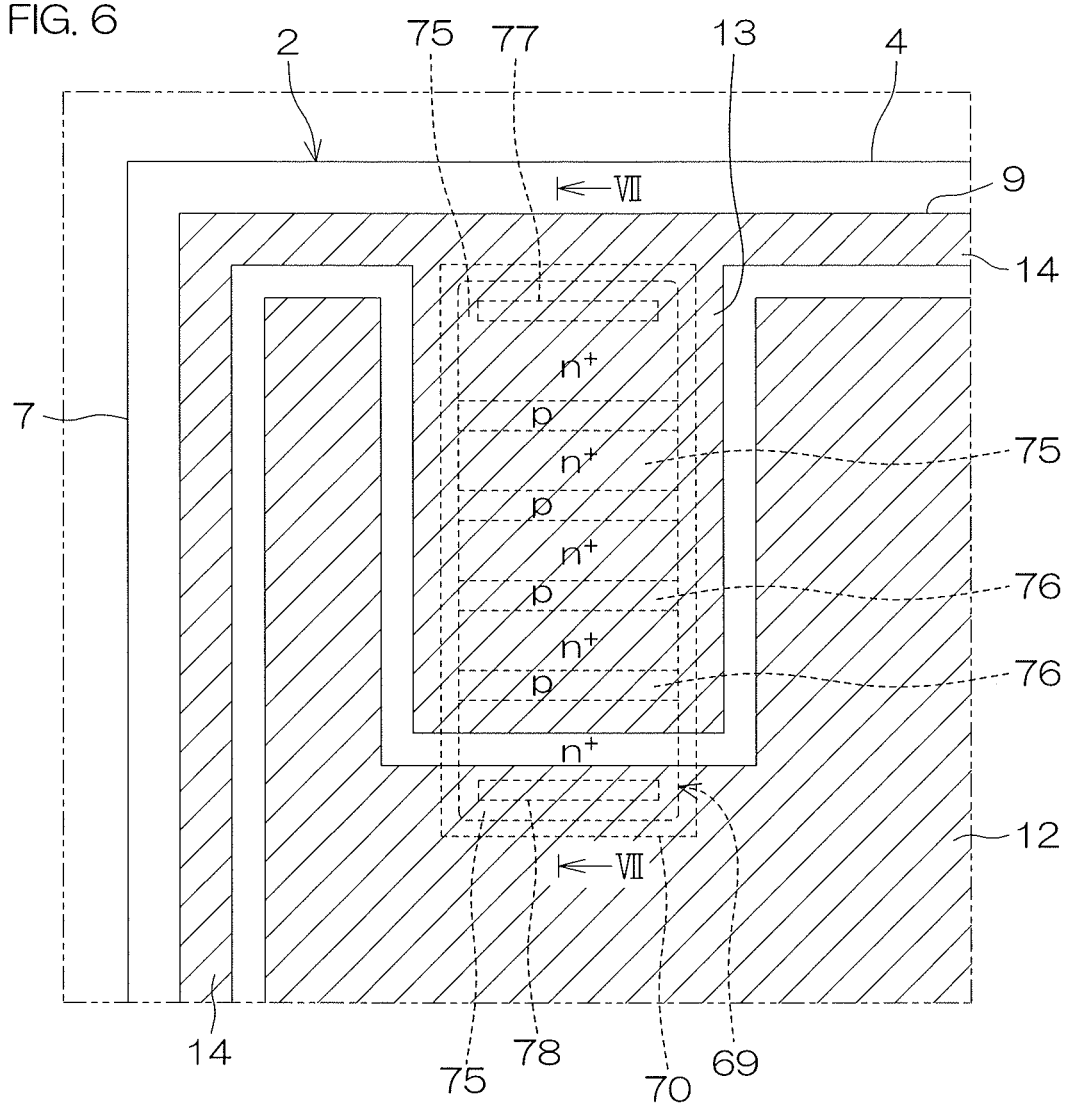
FIG. 6 is an enlarged view of a portion surrounded by alternate long and two short dashes lines VI of FIG. 1.
Figure 7:
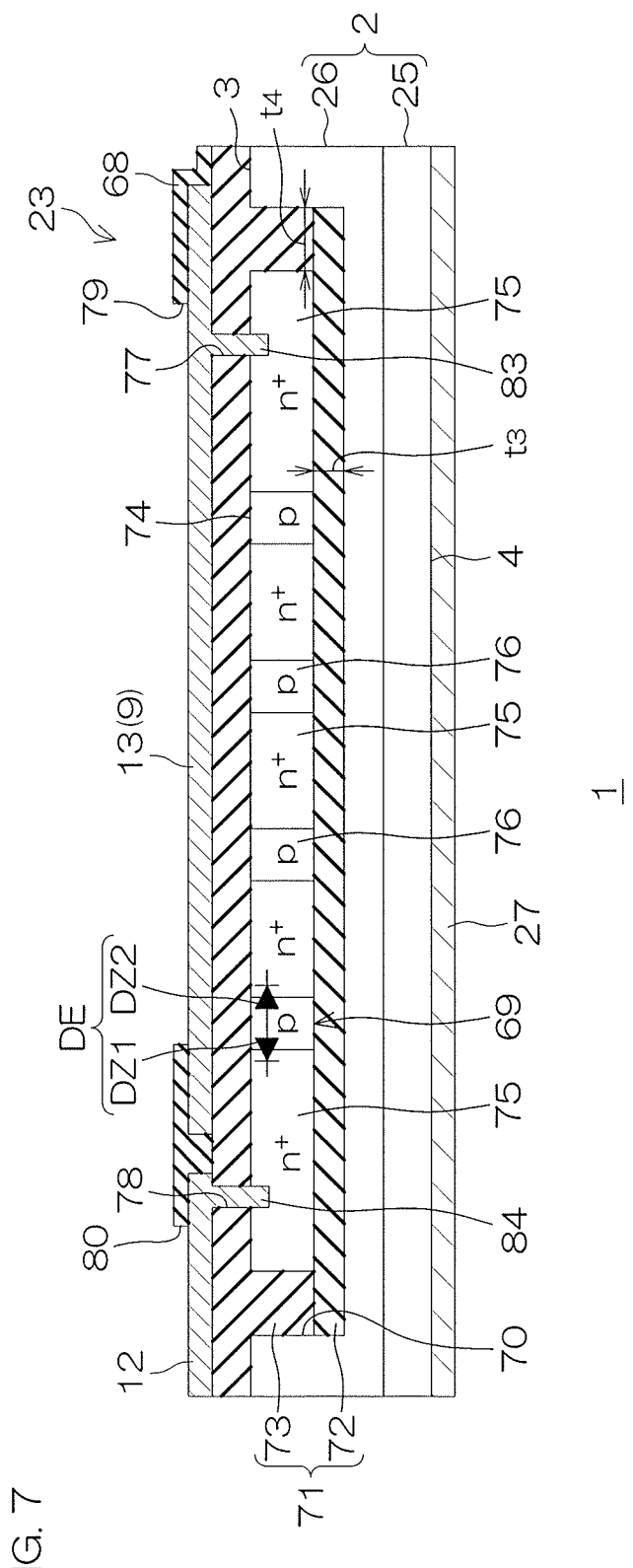
FIG. 7 is a sectional view taken along line VII-VII of FIG. 6.

FIG. 6 is an enlarged view of a portion surrounded by alternate long and two short dashes lines VI of FIG. 1. FIG. 7 is a sectional view taken along line VII-VII of FIG. 6.

A specific structure of a bidirectional Zener diode 69 included in the active region 23 of the semiconductor substrate 2 shall now be described with reference to FIG. 6 and FIG. 7.

A second trench 70 is formed in the epitaxial layer 26 of the semiconductor substrate 2. A depth of the second trench 70 may, for example, be the same as that of the gate trenches 29 and the first trench 50. Therefore, the depth of the second trench 70 may, for example, be 0.5 μm to 1.5 μm. Also, as shown in FIG. 7, the second trench 70 has a bottom portion at the first surface 3 side (that is, inside the epitaxial layer 26) of the semiconductor substrate 2 with respect to the interface between the base substrate 25 and the epitaxial layer 26.

The second trench 70 is lead out, independently of the gate trenches 29, from a region directly below the gate pad 13 to a region directly below the source conductive film 12. In the present preferred embodiment, the second trench 70 is formed to a quadrilateral shape in plan view.

The bidirectional Zener diode 69 is disposed inside the second trench 70. By a second insulating film 71 being formed on inner surfaces between the bidirectional Zener diode 69 and the second trench 70, the bidirectional Zener diode 69 and the semiconductor substrate 2 are insulated from each other.

The second insulating film 71 may, for example, be constituted of an insulating material, such as silicon oxide (SiO2), etc. The second insulating film 71 may include a first portion 72, formed on a bottom surface of the second trench 70, and a second portion 73, covering the bidirectional Zener diode 69 and embedded in a portion of the second trench 70 higher than the first portion 72.

The first portion 72 of the second insulating film 71 is formed to a uniform thickness over an entirety of the bottom surface of the second trench 70 and the thickness t3 may be the same as the thickness t1 of the first portion 52 of the first insulating film 51. Therefore, the thickness t3 of the first portion 72 of the second insulating film 71 may, for example, be 1500 Å to 4000 Å.

And the bidirectional Zener diode 69 is disposed on the second insulating film 71. The bidirectional Zener diode 69 may be constituted of the same material as the gate electrode 34 and the diodes 49 (polysilicon in the present preferred embodiment). In the present preferred embodiment, the bidirectional Zener diode 69 may, for example, be of a rectangular shape in plan view that is long in a length direction of the second trench 70 of rectangular shape in plan view.

Also, the bidirectional Zener diode 69 is formed across an interval from a side surface of the second trench 70. The bidirectional Zener diode 69 is thus disposed inside a region surrounded by the side surface of the second trench 70. A distance between a side surface of the bidirectional Zener diode 69 and the side surface of the second trench 70 is greater than a thickness of the bidirectional Zener diode 69. For example, the distance between the side surface of the bidirectional Zener diode 69 and the side surface of the second trench 70 may be 5 µm to 15 µm and the thickness of the bidirectional Zener diode 69 may be 3000 Å to 8000 Å.

As shown in FIG. 7, the bidirectional Zener diode 69 has an upper surface 74 (flat surface) that is flush with the first surface 3 of the semiconductor substrate 2. The upper surface 74 of the bidirectional Zener diode 69 may be parallel to the bottom surface of the second trench 70.

The bidirectional Zener diode 69 has one end portion positioned in the region directly below the gate pad 13 and the other end portion positioned in the region directly below the source conductive film 12.

The bidirectional Zener diode 69 includes n+ type portions 75 and p type portions 76 and has a structure where the n+ type portions 75 and the p type portions 76 are repeated alternately. The n+ type portions 75 are formed respectively at one end portion and at the other end portion of the bidirectional Zener diode 69. The n+ type portions 75 and the p type portions 76 are formed repeated alternately in a region between the pair of n+ type portions 75 formed respectively at both end portions of the bidirectional Zener diode 69.

The n+ type portions 75 and the p type portions 76 may respectively be formed as bands extending along an intersecting direction intersecting a direction in which the second trench 70 extends (long direction of the second trench 70) in plan view. The n+ type portions 75 and the p type portions 76 are thereby formed as stripes extending along the intersecting direction. The intersecting direction may be an orthogonal direction orthogonal to the direction in which the second trench 70 extends.

A pn junction portion is formed in each region between an n+ type portion 75 and a p type portion 76. By the pn junction portions, Zener diodes DZ1 and DZ2, each having an n+ type portion 75 as a cathode and a p type portion 76 as an anode, are formed.

The bidirectional Zener diode 69 includes a plurality (four, in the present preferred embodiment) of bidirectional Zener diode elements DE. Each bidirectional Zener diode element DE includes a pair of Zener diodes DZ1 and DZ2 that are electrically connected to each other via an anode (p type portion 76).

Mutually adjacent bidirectional Zener diode elements DE are electrically connected via a cathode (n+ type portion 75). In the present preferred embodiment a single bidirectional Zener diode 69 is formed by such a plurality of bidirectional Zener diode elements DE.

The bidirectional Zener diode 69 may be a structure that includes just one bidirectional Zener diode element DE. The bidirectional Zener diode 69 may thus have one pair of n+ type portions 75 and at least one p type portion 76 formed between the pair of n+ type portions 75.

Also, the n+ type portions 75 may, for example, have an n type impurity concentration substantially equal to the n type impurity concentration of the source region 36. The n type impurity concentration of the n+ type portions 75 may thus be, for example, $1.0 \times 10^{19}$ cm-3 to $1.0 \times 10^{20}$ cm-3. The p type portions 75 may, for example, have a p type impurity concentration substantially equal to the p type impurity concentration of the body region 37. The p type impurity concentration of the p type portions 76 may thus be, for example, $1.0 \times 10^{15}$ cm-3 to $1.0 \times 10^{17}$ cm-3.

As shown in FIG. 7, the second portion 73 of the second insulating film 71 completely fills portions between the bidirectional Zener diode 69 and the side surface of the second trench 70 and is formed on the semiconductor substrate 2 such that the second portion 73 of the second insulating film 71 covers the bidirectional Zener diode 69.

A thickness t4 of a portion of the second portion 73 on the side surface of the second trench 70 (portion in contact with the side surface of the second trench 70) is thicker than the thickness t3 of the first portion 72 and may be the same as the thickness t2 of the second portion 53 of the first insulating film 51. The thickness t4 of the second portion 73 of the second insulating film 71 may thus be, for example, 5 µm to 15 µm.

And the gate conductive film 9 and the source conductive film 12 are formed on the second portion 73 of the second insulating film 71.

A first contact hole 77 and a second contact hole 78 are formed in the second insulating film 71. The first contact hole 77 exposes the one end portion (n+ type portion 75) of the bidirectional Zener diode 69 that is positioned directly below the gate pad 13. The second contact hole 78 exposes the other end portion (n+ type portion 75) of the bidirectional Zener diode 69 that is positioned directly below the source conductive film 12.

The gate conductive film 9 (gate pad 13) is connected to the one end portion (n+ type portion 75) of the bidirectional Zener diode 69 via the first contact hole 77. The source conductive film 12 is connected to the other end portion (n+ type portion 75) of the bidirectional Zener diode 69 via the second contact hole 78. As shown in FIG. 7, the gate conductive film 9 and the source conductive film 12 may respectively be embeddedly connected to front surface portions of the n+ type portions 75, for example, by a first plug 83 and a second plug 84 that are constituted of a conductive material, such as tungsten (W), etc. The bidirectional Zener diode 69 is thereby electrically connected to the MISFET (unit cells 30) of the semiconductor device 1.

The passivation film 68 is formed on the second insulating film 71 such that the passivation film 68 covers the gate conductive film 9 and the source conductive film 12. Openings 79 and 80, exposing portions of the gate pad 13 and the source conductive film 12 to secure regions for wire bonding, are formed in the passivation film 68.

Operations and an overcurrent protection method of the semiconductor device 1 shall now be described more specifically.

A voltage is applied to the semiconductor device 1 by a gate driver G/D (not shown). Specifically, a bias voltage, such that the drain electrode 27 side becomes positive, is applied between the source conductive film 12 and the drain electrode 27. A reverse voltage is thereby applied to pn junctions at interfaces between the n type drain region 28 and the p type body regions 37, and consequently, the n+ type source regions 36 and the drain region 28, that is, a source and drain are put in an interrupted state between these regions. When in this state, a predetermined voltage, such that the gate pad 13 side becomes positive, is applied between the source conductive film 12 and the gate pad 13, a bias with respect to the p type body regions 37 is applied to the gate electrodes 34. Electrons are thereby induced and inversion channels are formed in the p type body regions 37 at the side surfaces of the gate trenches 29. The n+ type source regions 36 and the drain region 28 are made conductive therebetween via the inversion channels. The source and drain are thereby made conductive therebetween and a drain current Id flows.

On the other hand, a constant current is applied to the diodes 49 by the gate driver G/D (not shown). Also, a short circuit protection circuit (not shown) of the gate driver G/D constantly monitors a forward voltage VF of the diodes 49.

And when a short circuit occurs in the MISFET (a unit cell 30) of the semiconductor device 1 and an overcurrent flows, a temperature rise occurs at the first surface side of the semiconductor substrate 2. The temperature rise is also transmitted to the diodes 49 inside the active region 23 and the forward voltage VF of the diodes 49 thus decreases in accompaniment with the temperature rise. For example, a rising voltage of the diodes 49 shifts to a low voltage side. The short circuit protection circuit then detects the decrease of the forward voltage VF as the occurrence of the short circuit in the MISFET and turns off the voltage being applied to the gate pad 13. The drain current Id flowing across the source and drain (S-D) of the MISFET is thereby interrupted and the MISFET is protected.

FIG. 8A to FIG. 15A, FIG. 8B to FIG. 15B, and FIG. 8C to FIG. 15C are diagrams showing a manufacturing process of the semiconductor device 1 in the order of steps. FIG. 8A to FIG. 15A show steps related to forming of the unit cells 30, FIG. 8B to FIG. 15B show steps related to forming of the diodes 49, and FIG. 8C to FIG. 15C show steps related to forming of the bidirectional Zener diode 69.

Figure 8A:
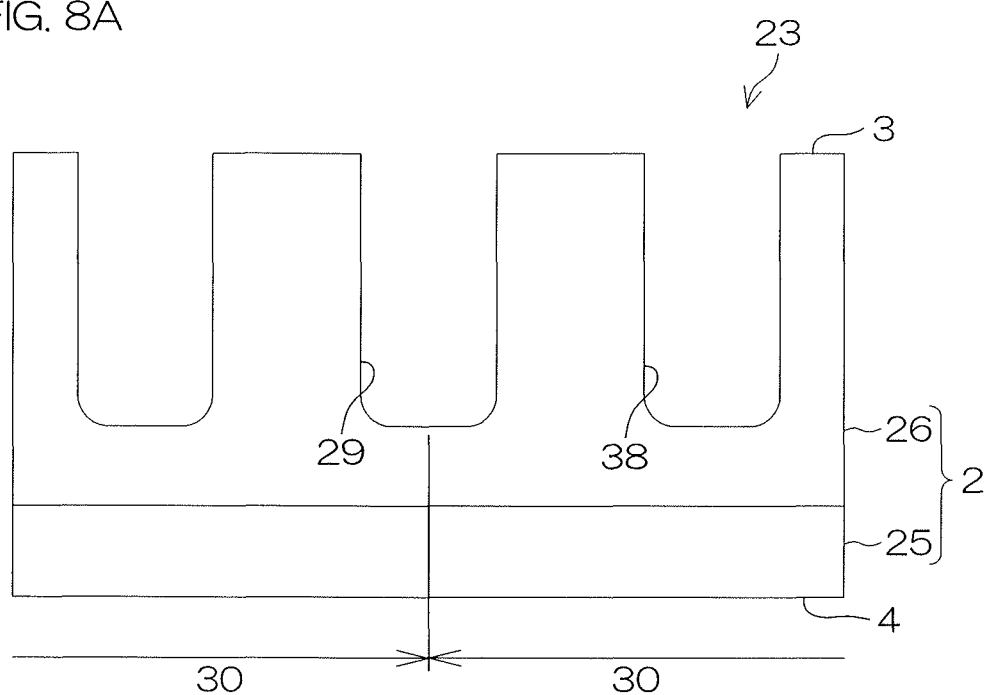
Figure 8B:
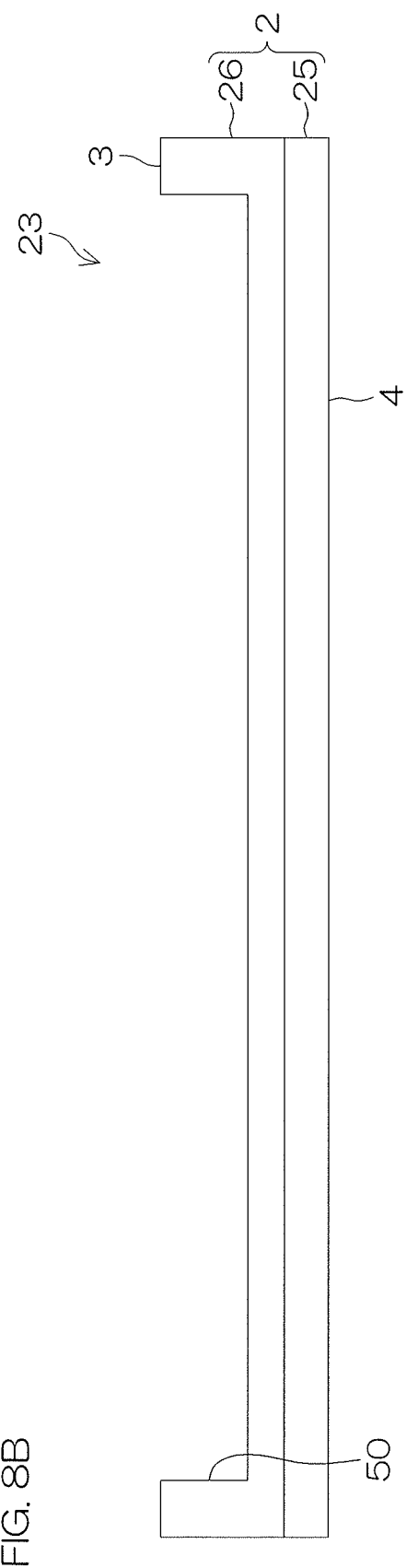

To manufacture the semiconductor device 1, first, referring to FIG. 8A, FIG. 8B, and FIG. 8C, the n+ type base substrate 25 is prepared. Next, silicon is epitaxially grown from a front surface (major surface) of the base substrate 25 while introducing an n type impurity. The n− type epitaxial layer 26 is thereby formed on the major surface of the base substrate 25. The semiconductor substrate 2 is formed by a laminated structure including the base substrate 25 and the epitaxial layer 26. The semiconductor substrate 2 has the first surface 3 and the second surface 4.

Next, a mask (not shown) is formed on the first surface 3 of the semiconductor substrate 2. Unnecessary portions of the semiconductor substrate 2 are then selectively removed by etching via the mask. The gate trenches 29, the source trenches 38, the first trench 50, and the second trench 70 are thereby formed at the same time in the first surface 3 of the semiconductor substrate 2.

Next, referring to FIG. 9A, FIG. 9B, and FIG. 9C, an insulating layer 85 is deposited on an entirety of the first surface 3 of the semiconductor substrate 2, for example, by a CVD method. The deposition of the insulating layer 85 is continued until the gate trenches 29, the source trenches 38, the first trench 50, and the second trench 70 are refilled with the insulating layer 85 and the first surface 3 of the semiconductor substrate 2 is covered by the insulating layer 85.

Figure 10A:
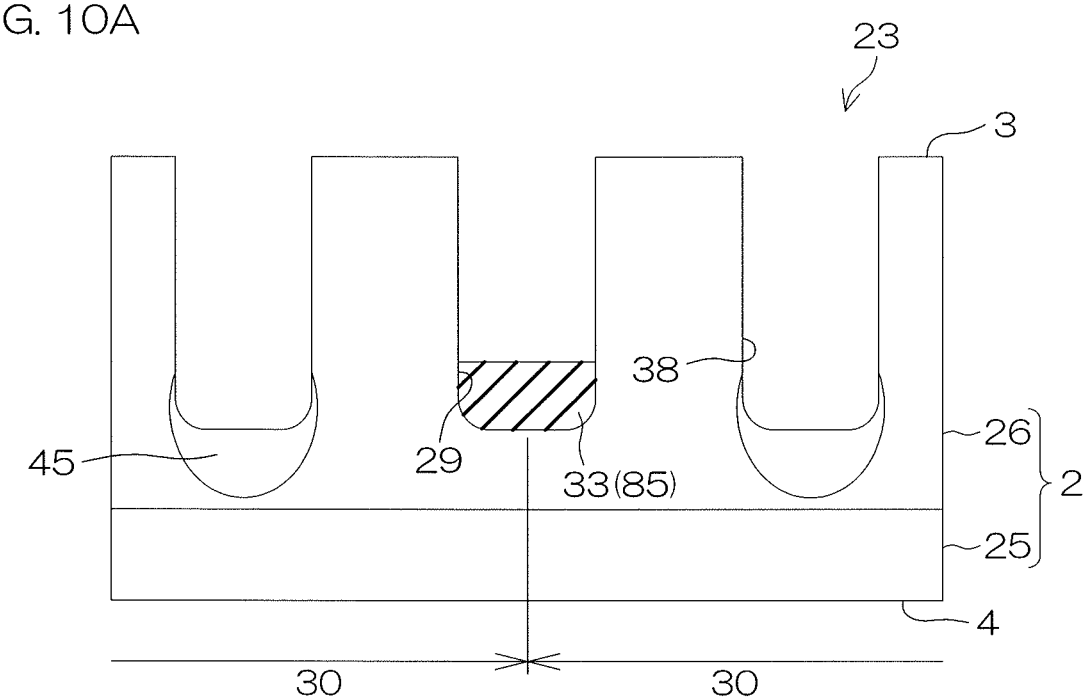

Next, referring to FIG. 10A, FIG. 10B, and FIG. 10C, unnecessary portions of the insulating layer 85 are selectively removed, for example, by etching back. The second portions 33 of the gate insulating films 31 that are constituted of the insulating layer 85 remaining at the bottom portions of the gate trenches 29, the first portion 52 of the first insulating film 51 that is constituted of the insulating layer 85 remaining at a bottom portion of the first trench 50, and the first portion 72 of the second insulating film 71 that is constituted of the insulating layer 85 remaining at a bottom portion of the second trench 70 are thereby formed.

Next, a p type impurity (for example, boron (B)) is introduced into the semiconductor substrate 2 exposed from the bottom surfaces of the source trenches 38. The p type impurity is, for example, implanted into the semiconductor substrate 2 via an unillustrated ion implantation mask. The second portions 45 of the p type impurity regions 43 that are oriented along the bottom surfaces of the source trenches 38 are thereby formed. In the present preferred embodiment, the second portions 45 are formed to shapes that bulgingly spread toward the second surface 4 of the semiconductor substrate 2 from the bottom surfaces and lower portions of the side surfaces of the source trenches 38.

Figure 11A:
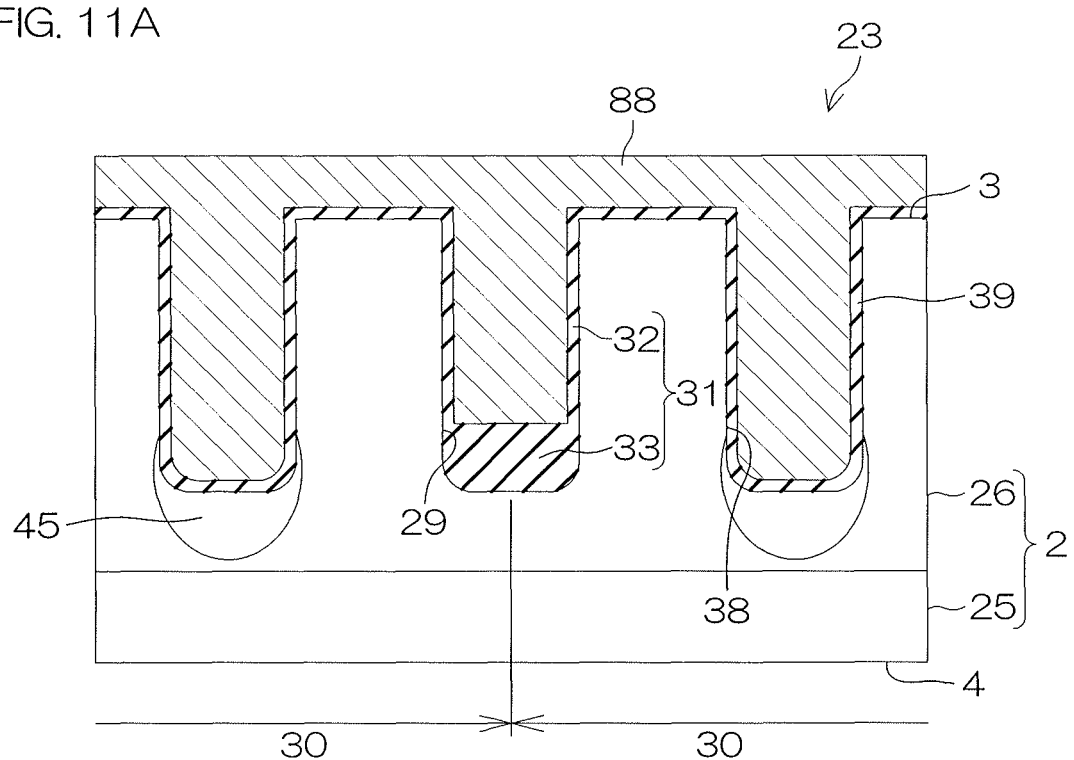
Figure 11C:
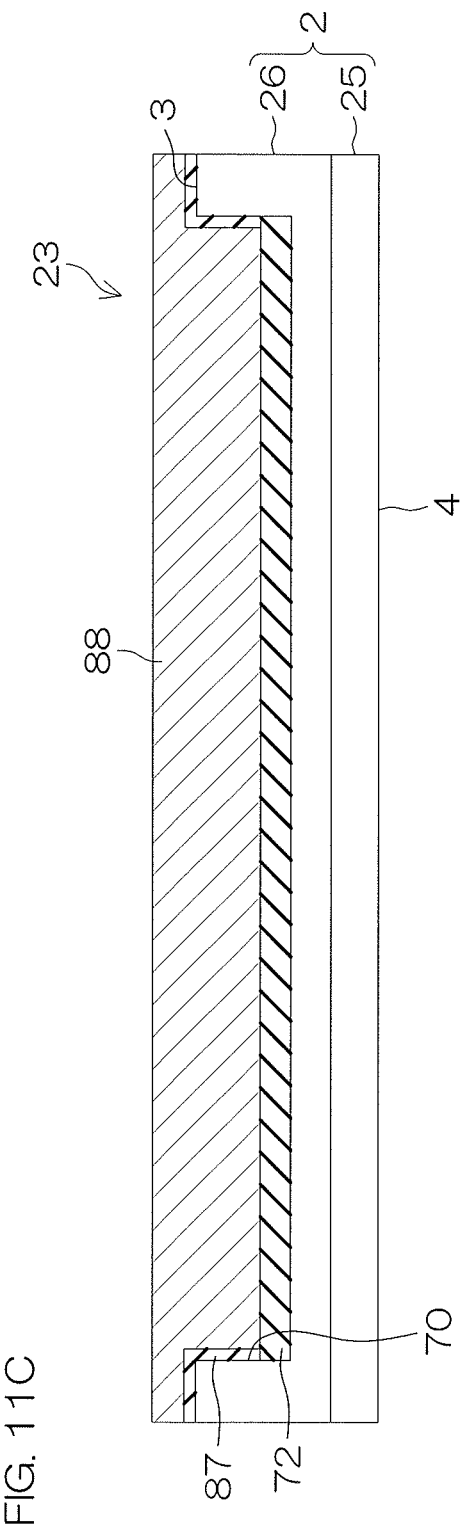

Next, referring to FIG. 11A, FIG. 11B, and FIG. 11C, the semiconductor substrate 2 exposed from the side surfaces of the gate trenches 29, the inner surfaces of the source trenches 38, the side surface of the first trench 50, and the side surface of the second trench 70 is oxidized, for example, by a thermal oxidation method or a wet oxidation method. Thereby, the first portions 32 of the gate insulating films 31 are formed on the inner surfaces of the gate trenches 29 and the insulating films 39 are formed on the inner surfaces of the source trenches 38. Also, an insulating film 86 and an insulating film 87 are respectively formed on the side surface of the first trench 50 and the side surface of the second trench 70.

Next, a conductive layer 88, constituted, for example, of polysilicon, is deposited on the entirety of the first surface 3 of the semiconductor substrate 2, for example, by the CVD method. The deposition of the conductive layer 88 is continued until the gate trenches 29, the source trenches 38, the first trench 50, and the second trench 70 are refilled with the conductive layer 88 and the first surface 3 of the semiconductor substrate 2 is covered by the conductive layer 88.

Figure 12A:
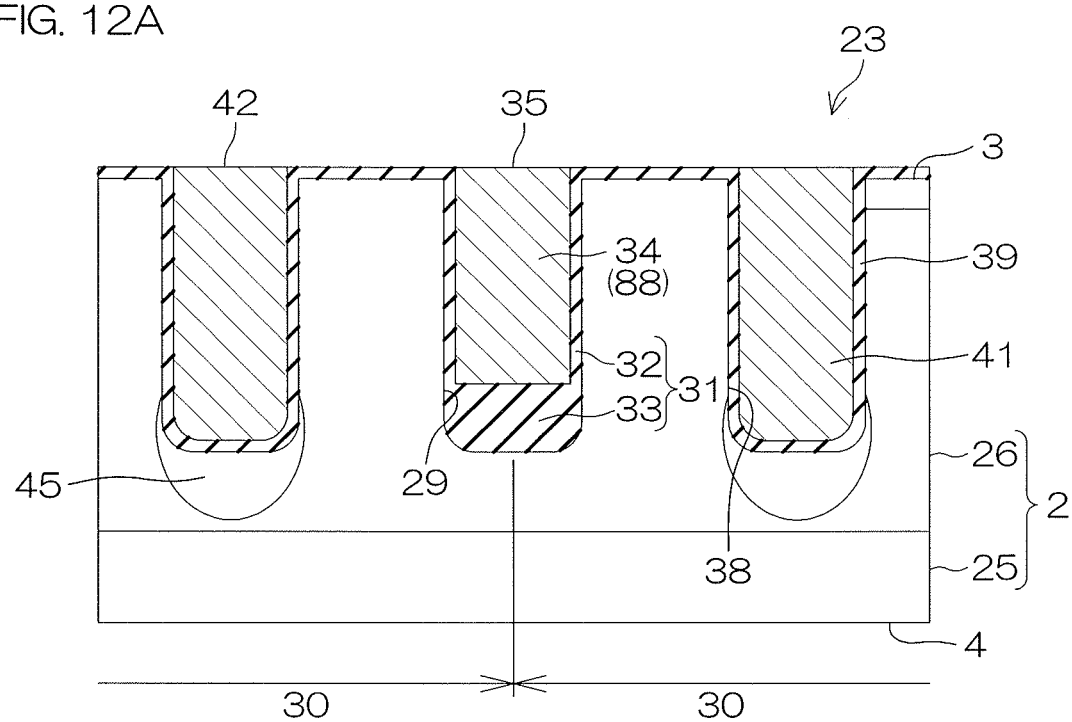
Figure 12C:
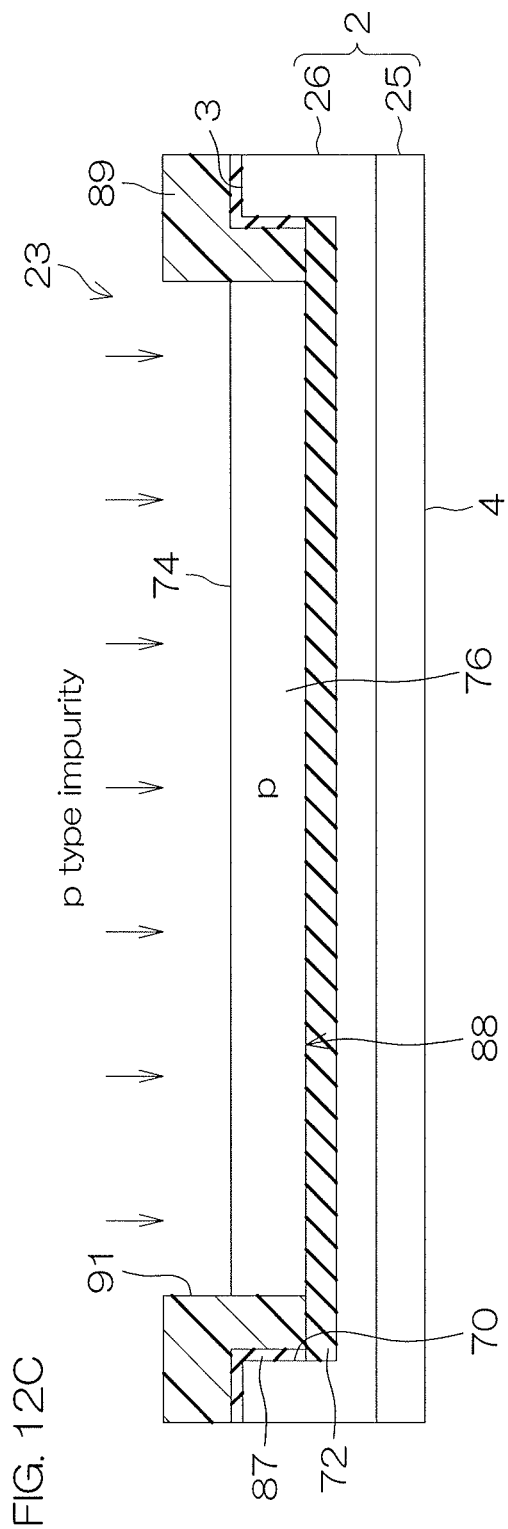

Next, referring to FIG. 12A, FIG. 12B, and FIG. 12C, unnecessary portions of the conductive layer 88 are selectively removed, for example, by etching back. The etch back is continued until the respective upper surfaces 35, 42, 54, and 74 of the conductive layers 88 become flush with the first surface 3 of the semiconductor substrate 2. The gate electrodes 34 and the conductive bodies 41 are thereby formed. Further, the conductive layers 88 inside the first trench 50 and the second trench 70 are selectively patterned to be in accordance with the shapes of the diodes 49 and the bidirectional Zener diode 69.

Next, a photomask 89 is formed on the first surface 3 of the semiconductor substrate 2. The photomask 89 may be of a negative type or may be of a positive type. Here, a description shall be provided for a negative type photomask 89 as an example.

Next, by exposure and development, openings 90 exposing the conductive layer 88 inside the first trench 50 and an opening 90 exposing the conductive layer 88 inside the second trench 70 are selectively formed in the photomask 89.

Next, the p type impurity (for example, boron (B)) is implanted via the photomask 89 into entireties of the conductive layers 88 respectively disposed in the first trench 50 and the second trench 70. The p type portions 55 of the diodes 49 and the p type portions 76 of the bidirectional Zener diode 69 are thereby formed in the entireties of the respective conductive layers 88. After the p type impurity is implanted, the photomask 89 is removed.

Next, referring to FIG. 13A, FIG. 13B, and FIG. 13C, a photomask 92 is formed on the first surface 3 of the semiconductor substrate 2. The photomask 92 may be of a negative type or may be of a positive type. Here, a description shall be provided for a negative type photomask 92 as an example.

Next, by exposure and development, openings 93, 94, and 95, respectively exposing regions in which the source regions 36, the n type portions 56 of the diodes 49, and the n+ type portions 75 of the bidirectional Zener diode 69 are to be formed, are selectively formed in the photomask 92.

Next, the n type impurity (for example, arsenic (As)) is implanted via the photomask 92 into the semiconductor substrate 2 and the conductive layers 88 respectively disposed in the first trench 50 and the second trench 70. The source regions 36, the n type portions 56 of the diodes 49, and the n+ type portions 75 of the bidirectional Zener diode 69 are thereby formed. After the n type impurity is implanted, the photomask 92 is removed.

Here, a case where the conductive layers 88 for the diodes 49 and the bidirectional Zener diode 69 are formed not inside trenches but on the first surface 3 of the semiconductor substrate 2 shall be considered. In this case, steps, corresponding to a thickness of the conductive layers 88, would be present between portions of the photomask 92 covering the conductive layers 88 on the first surface 3 of the semiconductor substrate 2 and a portion covering the first surface 3 of the semiconductor substrate 2.

In exposing the photomask 92, respectively different focus margins must be set for the portions covering the conductive layers 88 and the portion covering the first surface 3 of the semiconductor substrate 2. It therefore becomes entirely unrealistic to perform the exposure of the portions covering the conductive layers 88 and the exposure of the portion covering the first surface 3 of the semiconductor substrate 2 in the same step.

The focus margin is a width of a depth region, in which a photomask can be maintained in a practically usable state when a focal point of light with respect to the photomask deviates upward or downward from an optimal focal point position during exposure.

On the other hand, in the present preferred embodiment, the conductive layers 88 for the diodes 49 and the bidirectional Zener diode 69 are respectively disposed inside the first trench 50 and the second trench 70 and the upper surfaces 54 and 74 of the conductive layers 88 are formed on substantially the same plane as the first surface 3 of the semiconductor substrate 2. Therefore, the forming of steps between the portions of the photomask 92 covering the conductive layers 88 and the portion covering the first surface 3 of the semiconductor substrate 2 can be suppressed. Moreover, the upper surfaces 54 and 74 of the conductive layers 88 are formed flatly and therefore the forming of steps on the photomask 92 above the upper surfaces 54 and 74 of the conductive layers 88 can also be suppressed.

An equal focus margin can thus be set for the portions covering the conductive layers 88 and the first surface 3 of the semiconductor substrate 2 respectively when exposing the photomask 92.

Exposure focus can thereby be achieved with high precision when forming the n type portions 56 of the diodes 49 and the n+ type portions 75 of the bidirectional Zener diode 69. Consequently, dimensional variations of the p type portions 55 and the n type portions 56 of the diodes 49 and dimensional variations of the p type portions 76 and the n+ type portions 75 of the bidirectional Zener diode 69 can be suppressed.

Figure 14A:
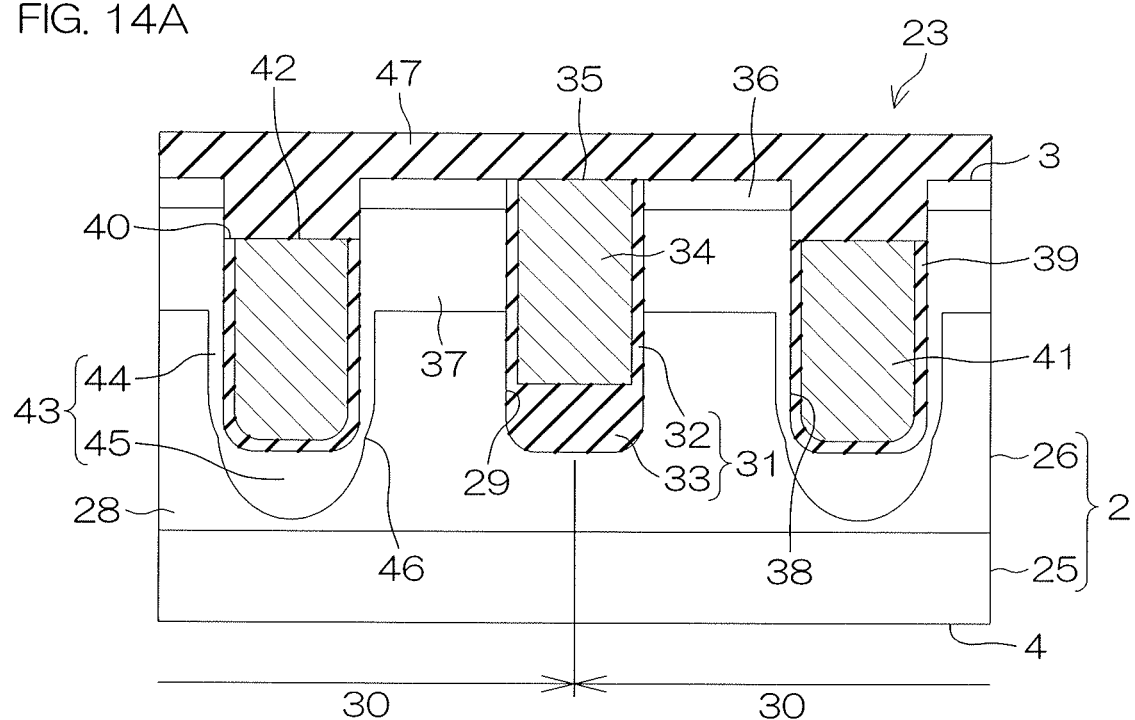

Next, referring to FIG. 14A, FIG. 14B, and FIG. 14C, by exposure and development, a photomask (not shown), having openings exposing regions in which the p type body regions 37 and the first portions 44 of the impurity regions 43 are to be formed, is formed on the first surface 3 of the semiconductor substrate 2. The p type impurity (for example, boron (B)) is implanted into the first surface 3 of the semiconductor substrate 2 via the photomask. The body regions 37 and the first portions 44 of the impurity regions 43 are thereby formed. After the p type impurity is implanted, the photomask is removed.

Next, the gate insulating film 31 on the first surface 3 of the semiconductor substrate 2, the insulating film 86, and the insulating film 87 are removed, for example, by etching back. The first surface 3 of the semiconductor substrate 2, the side surface of the first trench 50, and the side surface of the second trench 70 are thereby exposed.

Next, the insulating films 39 and the conductive bodies 41 inside the source trenches 38 are partially removed from upper portions. The upper end portions 40 of the insulating films 39 and the upper surfaces 42 of the conductive bodies 41 are thereby set at positions receded in the depth direction of the source trenches 38 with respect to the first surface 3 of the semiconductor substrate 2.

Next, an insulating material is deposited on the entirety of the first surface 3 of the semiconductor substrate 2, for example, by the CVD method. The insulating layer 47, the second portion 53 of the first insulating film 51, and the second portion 73 of the second insulating film 71 are thereby formed. The insulating layer 47, the second portion 53 of the first insulating film 51, and the second portion 73 of the second insulating film 71 are insulating films formed in the same step and may be referred to, for example, as interlayer insulating films as a name in common.

Figure 15A:
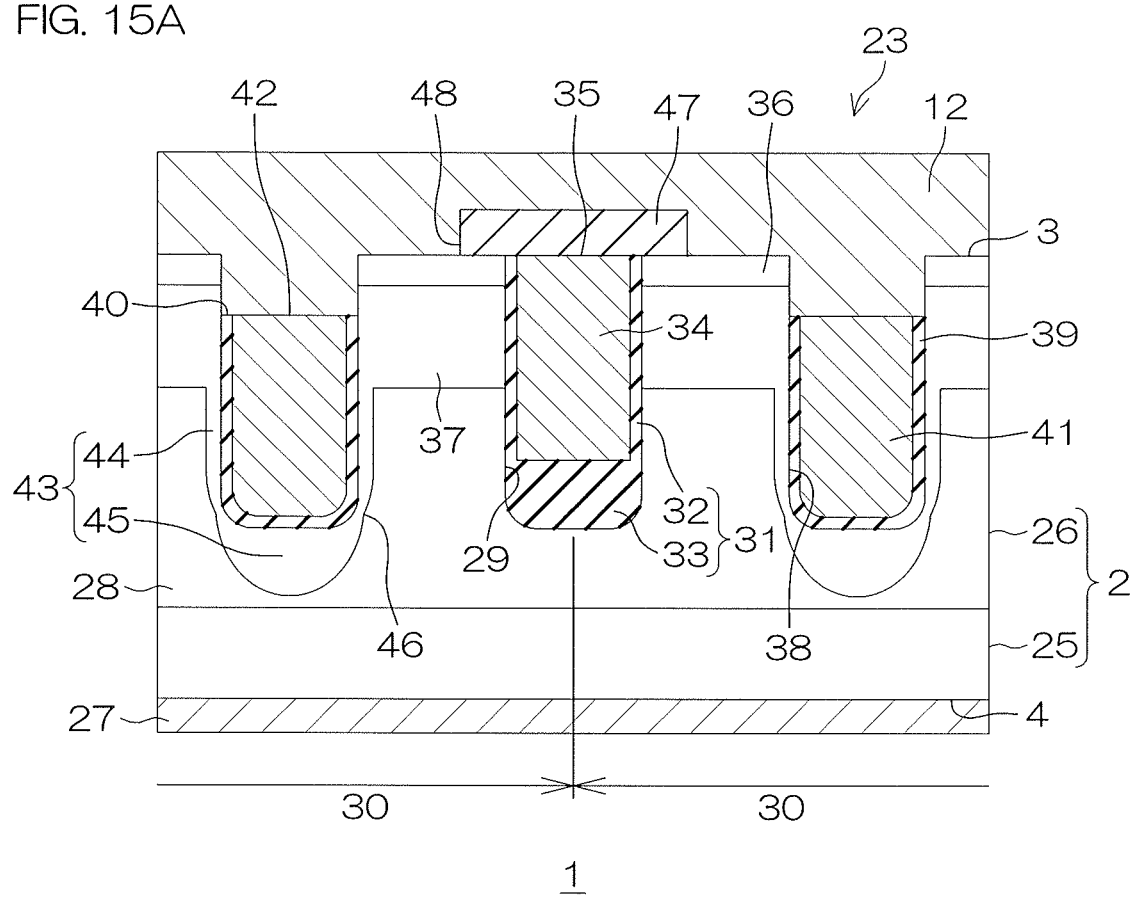
FIG. 15A to FIG. 15C are each a diagram showing a step after that of FIG. 14A to FIG. 14C.
Figure 15B:
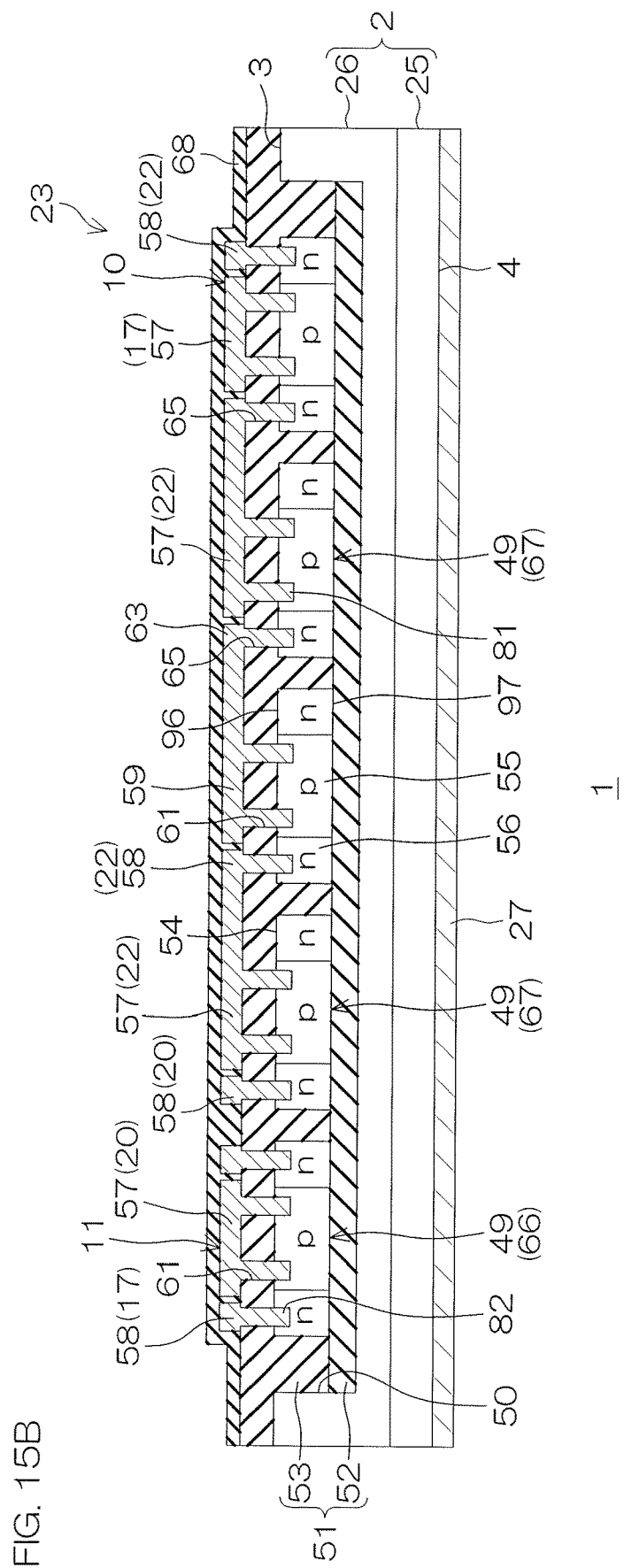
Figure 15C:
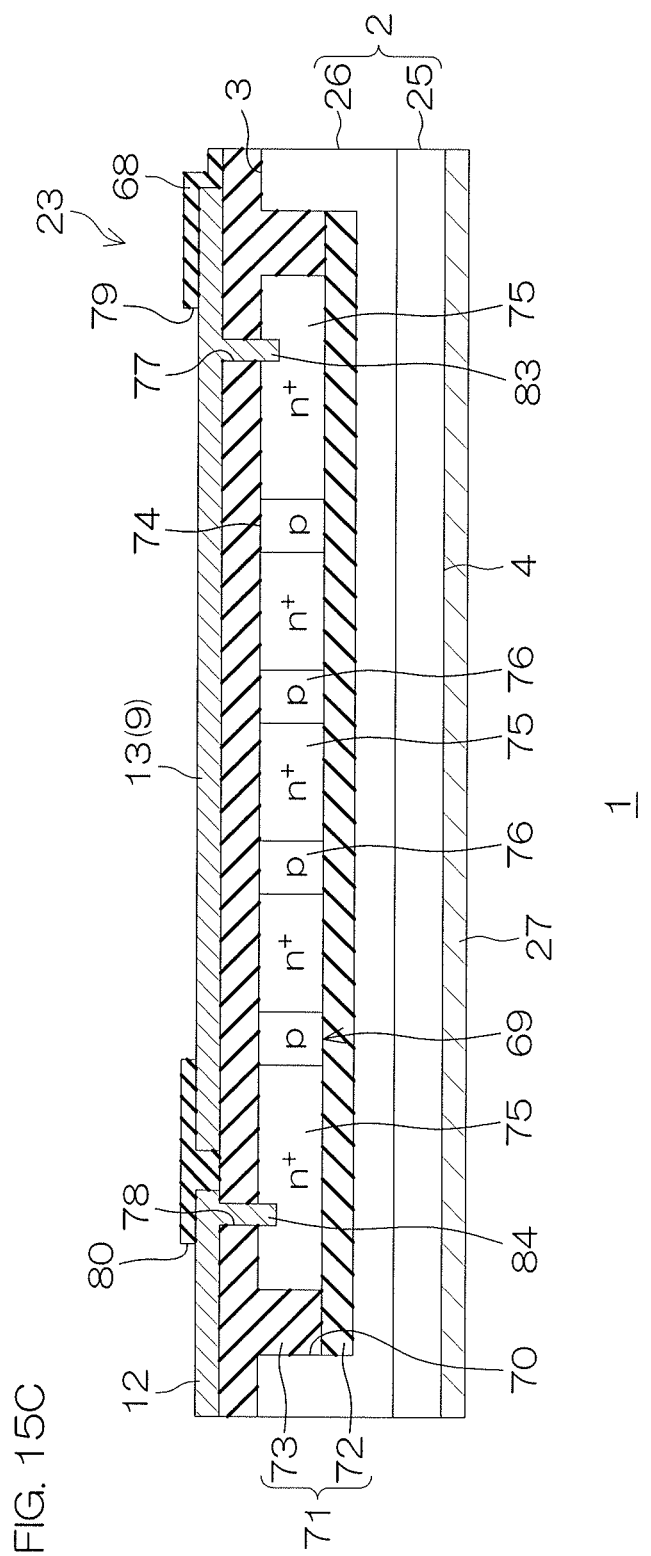

Next, referring to FIG. 15A, FIG. 15B, and FIG. 15C, unnecessary portions of the insulating layer 47, the second portion 53 of the first insulating film 51, and the second portion 73 of the second insulating film 71 are removed by etching via a mask (not shown). The contact holes 48, the first contact holes 61, the second contact holes 65, the first contact hole 77, and the second contact hole 78 are thereby formed.

Next, the first plugs 81, the second plugs 82, the first plug 83, and the second plug 84 are respectively embedded in the first contact holes 61, the second contact holes 65, the first contact hole 77, and the second contact hole 78.

Next, an electrode material (for example, AlCu) is deposited on the insulating layer 47, the second portion 53 of the first insulating layer 51, and the second portion 73 of the second insulating layer 71, for example, by a sputtering method, to form an electrode material layer. Next, unnecessary portions of the electrode material layer are removed, for example, by etching via a mask (not shown). The conductive patterns, including the gate conductive film 9, the anode conductive film 10, the cathode conductive film 11, the source conductive film 12, and the diode wirings 22, are thereby formed.

Next, the passivation film 68, selectively covering the gate conductive film 9, the anode conductive film 10, the cathode conductive film 11, the source conductive film 12, and the diode wirings 22 is formed.

Thereafter the drain electrode 27 is formed on the second surface 4 of the semiconductor substrate 2, for example, by the sputtering method. The semiconductor device 1 is obtained through the above steps.

FIG. 16 is a schematic view of a semiconductor package 101 that includes the semiconductor device 1. In FIG. 16, a resin package 103 is indicated by broken lines for clarification of an interior of the semiconductor package 101.

The semiconductor package 101 includes a terminal frame 102, the semiconductor device 1 (chip), and the resin package 103.

The terminal frame 102 has a plate shape made of metal. The terminal frame 102 includes a base portion 104 (island), supporting the semiconductor device 1, a drain terminal 105, source terminals 106, a gate terminal 107, an anode terminal 108, and a cathode terminal 109.

The base portion 104 is formed to a quadrilateral shape in plan view. In the present preferred embodiment, the base portion 104 is formed to a rectangular shape in plan view having a pair of long sides and a pair of short sides. The semiconductor device 1 is supported by the base portion 104 by the drain electrode 27 (see FIG. 2) and the base portion 104 being bonded via a bonding material, such as a silver paste, etc. The semiconductor device 1 may be disposed, for example, such that the pair of long sides of the semiconductor substrate 2 and the pair of long sides of the base portion 104 are parallel.

The drain terminal 105 is formed integrally with the base portion 104. The drain terminal 105 is formed to a width spanning substantially an entirety of one long side of the pair of long sides of the base portion 104. In the present preferred embodiment, the drain terminal 105 is formed such that the drain terminal 105 projects in an opposite direction of the semiconductor device 1 from the one long side of the pair of long sides of the base portion 104.

The source terminals 106, the gate terminal 107, the anode terminal 108, and the cathode terminal 109 are disposed at an opposite side from the drain terminal 105 with respect to the semiconductor device 1. The source terminals 106, the gate terminal 107, the anode terminal 108, and the cathode terminal 109 are formed separately from the base portion 104.

The source terminals 106, the gate terminal 107, the anode terminal 108, and the cathode terminal 109 may respectively be formed to rectilinearly extending shapes. Also, just one of each of the source terminal 106, the gate terminal 107, the anode terminal 108, and the cathode terminal 109 may be formed or a plurality of each may be formed. In the present preferred embodiment, a plurality of the source terminals 106, through which a relatively large current flows in comparison to the gate terminal 107, the anode terminal 108, and the cathode terminal 109, are formed.

The source terminals 106 are connected to the source conductive film 12 of the semiconductor device 1 via source wires 110. A plurality of the source wires 110 may be formed. Each source wire 110 may be connected to the source conductive film 12 at two locations of a first portion 114 and a second portion 115, at an opposite side of the first portion 114, that sandwich the diode 49. Some of source wires 110 may overlap with a diode 49.

The gate terminal 107, the anode terminal 108, and the cathode terminal 109 are respectively connected to the gate pad 13, the anode pad 15, and the cathode pad 18 of the semiconductor device 1 via a gate wire 111, an anode wire 112, and a cathode wire 113. One each of the gate wire 111, the anode wire 112, and the cathode wire 113 may be formed.

The resin package 103 is constituted, for example, of a known molding resin, such as epoxy resin, etc., and seals the semiconductor device 1. The resin package 103 covers the base portion 104 of the terminal frame 102 and the wires 110 to 113, together with the semiconductor device 1. Portions of the respective terminals 105 to 109 are exposed from the resin package 103.

Although a preferred embodiment of the present invention has been described above, the present invention may be implemented in other modes.

For example, an arrangement where the conductivity types of the respective semiconductor portions of the semiconductor device 1 are inverted may be adopted. That is, in the semiconductor device 1, a p type portion may be of an n type and an n type portion may be of a p type.

Also, although with the preferred embodiment described above, a MISFET was indicated as an example of the transistor structure of the semiconductor device 1, the transistor structure included in the semiconductor device 1 may instead be, for example, an IGBT (insulated gate bipolar transistor), a JFET (junction field effect transistor), a bipolar transistor, a thyristor, etc.

Besides the above, various design changes may be made within the scope of the matters described in the claims.

What is claimed is:

1. A semiconductor device comprising:
   a semiconductor layer;
   a transistor cell portion, formed in the semiconductor layer;
   a first trench, formed in the semiconductor layer;
   a plurality of diodes, electrically separated from the transistor cell portion and disposed inside the first trench, the plurality of diodes being apart from a side surface of the first trench, the plurality of diodes being physically independent from each other, each of the plurality of diodes having a first conductivity type portion, which is formed to an annular shape in plan view, and a second conductivity type portion, which is formed in a region surrounded by the first conductivity type portion;
   a second trench, formed in the semiconductor layer;
   a bidirectional Zener diode, electrically connected to the transistor cell portion and having a pair of first conductivity type portions, disposed inside the second trench, and at least one second conductivity type portion, formed between the pair of first conductivity type portion;

a first wiring and a second wiring formed on the semiconductor layer, the first wiring and the second wiring facing each other through the first trench in a first direction;

a first electrode extending from the first wiring toward the second wiring in the first direction, the first electrode being connected to the first conductivity type portion of at least one of the plurality of diodes;

a second electrode extending from the second wiring toward the first wiring in the first direction, the second electrode being connected to the second conductivity type portion of at least one of the plurality of diodes, and a surface conductive film formed on the semiconductor layer such that the surface conductive film covers substantially an entirety of the semiconductor layer, the surface conductive film having a diode opening from which the first wiring, the second wiring and the first trench are exposed, wherein the diode opening is formed in a central portion of the surface conductive film, the first wiring includes a first finger extending from a peripheral edge portion of the semiconductor layer to the diode opening in plan view, the second wiring includes a second finger extending from the peripheral edge portion of the semiconductor layer to the diode opening in plan view such that the second finger is parallel to the first finger, the plurality of the diodes are provided in a region sandwiched between the first finger and the second finger such that the plurality of the diodes are not overlapped with the first finger and the second finger in plan view, and the plurality of the diodes are mutually electrically connected to each other, the plurality of diodes include one first diode and a plurality of second diodes, connected in parallel to the first diode and connected serially to each other, the one first diode has the same plane size as each of the plurality of second diode, the semiconductor layer is formed in a rectangular shape in plan view, the semiconductor device further comprises:

a first pad electrically connected to the first wiring; and a second pad electrically connected to the second wiring, wherein the first pad and the second pad are disposed alongside each other at a first corner portion of the semiconductor layer, the semiconductor device further comprises:

a gate pad disposed at a second corner portion adjacent to the first corner portion of the semiconductor layer; and a gate finger extending from the gate pad and having an annular shape over an entirety of the peripheral edge portion of the semiconductor layer, the gate finger electrically connected to a gate electrode of the transistor cell portion, wherein the first wiring, the second wiring and the gate finger are disposed in parallel with each other along the peripheral edge portion of the semiconductor layer between the first corner portion and the second corner portion, wherein the semiconductor layer is formed in a rectangular shape in plan view, having a pair of short sides along the first direction and a pair of long sides along a second direction perpendicular to the first direction, the first corner portion and the second corner portion are disposed at one end of the short side and at the other end of the short side, respectively, the first wiring and the second wiring extend along the short sides, wherein the first trench is formed in a rectangular shape in plan view, having a pair of short sides along the first direction and a pair of long sides along the second direction, the first finger and the second finger extend along the second direction between the short side of the semiconductor layer and the short side of the first trench such that the first finger and the second finger are parallel to each other, and a region between the first finger and the second finger includes a first region over the first trench which has a first width and a second region formed between the short side of the semiconductor layer and the short side of the first trench which has a second width smaller than the first width, wherein the first finger includes a first longitudinal portion extending along the second direction from a first end to a second end of one of the long sides of the first trench, a first lateral portion bending in the first direction from a first end of the first longitudinal portion on the side of the second end of one of the long sides of the first trench, and a second lateral portion bending in the first direction from a second end of the first longitudinal portion on the side of the first end of one of the long sides of the first trench, the first lateral portion of the first finger is straddled between both ends of one of the short sides of the first trench; and the second lateral portion of the first finger is shorter than the first lateral portion and has an end midway in the first direction on the other short side of the first trench.

2. The semiconductor device according to claim 1, further comprising: a first insulating film, formed between an inner surface of the first trench and the diode; and wherein the first insulating film includes a first portion, disposed at a bottom surface of the first trench, and a second portion, formed thicker than the first portion of the insulating film and disposed at the side surface of the first trench.

3. The semiconductor device according to claim 1, wherein the second conductivity type portion of the diode is formed to a circular shape in plan view.

4. The semiconductor device according to claim 1, wherein the transistor cell portion includes a gate trench, a first conductivity type source region, formed at a side of the gate trench and exposed at a front surface of the semiconductor layer, a second conductivity type body region, formed at the side of the gate trench such that the body region is in contact with the source region, a first conductivity type drain region, formed at the side of the gate trench such that the drain region is in contact with the body region, a gate insulating film, formed on an inner surface of the gate trench, and the gate electrode, embedded in the gate trench via the gate insulating film, and the plurality of diodes and the bidirectional Zener diode are constituted of the same material as the gate electrode.

5. The semiconductor device according to claim 4, wherein the gate electrode, the plurality of diodes, and the bidirectional Zener diode are constituted of polysilicon.

6. The semiconductor device according to claim 4, wherein the gate trench, the first trench, and the second trench have the same depth as each other.

7. The semiconductor device according to claim 4, wherein the gate insulating film includes a first portion, disposed at a side surface of the gate trench and a second portion, formed thicker than the first portion of the gate insulating film and disposed at a bottom surface of the gate trench.

8. The semiconductor device according to claim 4, further comprising: a source trench, passing through the source region and the body region from the front surface of the semiconductor layer and reaching the drain region;
an insulating film formed on an inner surface of the source trench such that the source region and the body region are exposed from the insulating film; and
a conductive body, embedded in the source trench via the insulating film and constituted of the same material as the gate electrode.

9. The semiconductor device according to claim 8, further comprising: a second conductivity type impurity region formed at a bottom portion of the source trench.

10. The semiconductor device according to claim 8, wherein the gate trench, the first trench, the second trench, and the source trench have the same depth as each other.

11. The semiconductor device according to claim 1, further comprising: a second insulating film, formed between an inner surface of the second trench and the bidirectional Zener diode; and
wherein the second insulating film includes a first portion, disposed at a bottom surface of the second trench, and a second portion, formed thicker than the first portion of the second insulating film and disposed at a side surface of the second trench.

12. The semiconductor device according to claim 4, wherein one of the pair of first conductivity type portions of the bidirectional Zener diode is electrically connected to the gate electrode and the other of the pair of first conductivity type portions is electrically connected to the source region.

13. The semiconductor device according to claim 1, wherein
the first trench is formed in a rectangular shape in plan view, having a pair of short sides along the first direction and a pair of long sides along a second direction perpendicular to the first direction,
the first wiring extends along one of the pair of long sides of the first trench,
the second wiring extends along the other of the pair of long sides of the first trench,
the plurality of diodes are aligned along the pair of long sides of the first trench.

14. The semiconductor device according to claim 13, wherein
the first trench is formed in a central portion of the semiconductor layer, and
the second trench is formed on a peripheral edge portion of the semiconductor layer.

15. The semiconductor device according to claim 4, wherein the surface conductive film includes a source conductive film connected to the source region.

16. The semiconductor device according to claim 15, wherein the bidirectional Zener diode has one end portion positioned in a region directly below the gate pad and the other end portion positioned in a region directly below the source conductive film.

17. The semiconductor device according to claim 1, wherein
the second finger includes a second longitudinal portion extending along the second direction from a first end to a second end of the other long side of the first trench; and
the second longitudinal portion and the first lateral portion are spaced apart and opposite each other at one corner of the first trench.

* * * * *